US012660490B2

(12) United States Patent
Yoo et al.

(10) Patent No.: US 12,660,490 B2
(45) Date of Patent: Jun. 16, 2026

(54) DISPLAY APPARATUS, APPARATUS FOR ATTACHING COVER PANEL, AND METHOD OF ATTACHING COVER PANEL

(71) Applicant: SAMSUNG DISPLAY CO., LTD., Yongin-si (KR)

(72) Inventors: Kisang Yoo, Yongin-si (KR); Cheuljin Park, Yongin-si (KR); Hyunkyung Yun, Yongin-si (KR); Joonik Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/824,126

(22) Filed: May 25, 2022

(65) Prior Publication Data

US 2023/0113065 A1     Apr. 13, 2023

(30) Foreign Application Priority Data

Oct. 13, 2021     (KR) ........................ 10-2021-0135931

(51) Int. Cl.
| | |
|---|---|
| *H10K 71/00* | (2023.01) |
| *B32B 3/30* | (2006.01) |
| *B32B 7/12* | (2006.01) |
| *B32B 17/10* | (2006.01) |
| *B32B 27/28* | (2006.01) |
| *H10K 50/84* | (2023.01) |

(Continued)

(52) U.S. Cl.
CPC ............... *H10K 71/00* (2023.02); *B32B 3/30* (2013.01); *B32B 7/12* (2013.01); *B32B 17/10* (2013.01); *B32B 27/281* (2013.01); *H10K*

*50/841* (2023.02); *H10P 74/23* (2026.01); *B32B 2457/206* (2013.01); *H10K 59/122* (2023.02)

(58) Field of Classification Search
CPC .... H10K 71/00; H10K 50/841; H10K 59/122; H10K 30/87; H10K 2102/311; B32B 3/30; B32B 3/02; B32B 3/266; B32B 7/12; B32B 17/10; B32B 27/281; B32B 2457/206; B32B 2457/20; B32B 15/00; B32B 23/00; B32B 2255/205
USPC ................ 428/131, 156, 157, 172, 212, 213
See application file for complete search history.

(56) References Cited

U.S. PATENT DOCUMENTS

| | | | |
|---|---|---|---|
| 11,016,612 | B2 | 5/2021 | Han et al. |
| 11,528,812 | B2 | 12/2022 | Ahn et al. |
| 11,751,416 | B2 | 9/2023 | Mun et al. |

(Continued)

FOREIGN PATENT DOCUMENTS

| | | |
|---|---|---|
| KR | 20150133893 A | 12/2015 |
| KR | 1020180064610 A | 6/2018 |

(Continued)

*Primary Examiner* — Megha M Gaitonde
(74) *Attorney, Agent, or Firm* — CANTOR COLBURN LLP

(57) ABSTRACT

A display apparatus includes a display panel including a central area and an outer area outside the central area and which is bent. A cover panel includes a cover central area overlapping the central area, a cover outer area overlapping the outer area, a light-blocking layer on the display panel and a groove layer disposed on a first surface of the light-blocking layer opposite to a second surface of the light-blocking layer facing the display panel. A plurality of grooves is defined in the groove layer in the cover central area.

9 Claims, 32 Drawing Sheets

(51) Int. Cl.
    *H10P 74/00*      (2026.01)
    *H10K 59/122*      (2023.01)

(56)            References Cited

U.S. PATENT DOCUMENTS

| | | | |
|---|---|---|---|
| 11,927,987 | B2 | 3/2024 | Lee et al. |
| 2014/0049522 | A1* | 2/2014 | Mathew ............. H10K 59/8793 |
| | | | 345/82 |
| 2018/0157375 | A1* | 6/2018 | Han ...................... B44C 5/0469 |
| 2019/0377385 | A1* | 12/2019 | Bushnell ................ H10K 50/84 |
| 2021/0124391 | A1 | 4/2021 | Kim et al. |
| 2021/0126223 | A1 | 4/2021 | Choi et al. |

FOREIGN PATENT DOCUMENTS

| | | | |
|---|---|---|---|
| KR | 1020200063379 | A | 6/2020 |
| KR | 1020200138461 | A | 12/2020 |
| KR | 1020210008262 | A | 1/2021 |
| KR | 1020210049326 | A | 5/2021 |
| KR | 1020210052655 | A | 5/2021 |

* cited by examiner

DISPLAY APPARATUS, APPARATUS FOR ATTACHING COVER PANEL, AND METHOD OF ATTACHING COVER PANEL

This application claims priority to Korean Patent Application No. 10-2021-0135931, filed on Oct. 13, 2021, and all the benefits accruing therefrom under 35 U.S.C. § 119, the content of which in its entirety is herein incorporated by reference.

BACKGROUND

1. Field

Embodiments relate to a display apparatus including a display panel and a cover panel, an apparatus for attaching a cover panel, and a method of attaching a cover panel.

2. Description of the Related Art

Mobile electronic apparatuses are being widely used. As mobile electronic apparatuses, not only miniaturized electronic apparatuses such as mobile phones but also tablet personal computers are being widely used.

To support various functions, e.g., providing a user with visual information such as images, the mobile electronic apparatuses include a display apparatus. Recently, since the parts driving a display apparatus are being miniaturized, a proportion of the display apparatus in an electronic apparatus is being gradually increased and a structure that may be bent to define a preset angle with respect to a flat state is also under development.

SUMMARY

A display apparatus may include a display panel and a cover panel, the display panel displaying images, and the cover panel shielding external light not to transmit the external light toward the display panel. The cover panel may be attached to the display panel by an apparatus for attaching a cover panel.

Embodiments include an apparatus for attaching a cover panel and a method of attaching a cover panel, which accurately align a cover panel and attach the cover panel to a display panel. Embodiments include a display apparatus including a cover panel and a display panel and configured not to transmit external light from the cover panel to the display panel.

Additional features will be set forth in part in the description which follows and, in part, will be apparent from the description, or may be learned by practice of the presented embodiments of the invention.

In an embodiment according to the invention, a display apparatus includes a display panel including a central area and an outer area outside the central area and which is bent, and a cover panel including a cover central area overlapping the central area, a cover outer area overlapping the outer area, a light-blocking layer on the display panel; and a groove layer disposed on a first surface of the light-blocking layer opposite to a second surface of the light-blocking layer facing the display panel. A plurality of grooves is defined in the groove layer in the cover central area.

In an embodiment, the cover central area may be flat.

In an embodiment, the outer area may include a first adjacent area adjacent to the central area in a first direction, a second adjacent area adjacent to the central area in a second direction crossing the first direction, and a corner area at least partially surrounding the first adjacent area, the central area, and the second adjacent area, where the first adjacent area, the second adjacent area, and the central area may be bent.

In an embodiment, the corner area may include a plurality of corner areas, the cover outer area may include a plurality of cover corner areas respectively overlapping the plurality of corner areas, and each of the plurality of grooves may be adjacent to the plurality of cover corner areas.

In an embodiment, the cover outer area may include a cover corner area overlapping the corner area, and the light-blocking layer may be disposed in the cover central area and the cover corner area.

In an embodiment, the corner area may include a plurality of extension areas extending in a direction away from the central area, and a separation area may be defined between adjacent extension areas of the plurality of extension areas.

In an embodiment, the groove layer may include a cushion layer disposed on the first surface of the light-blocking layer, an organic layer which is disposed on a first surface of the cushion layer opposite to a second surface of the cushion layer facing the light-blocking layer and in which an organic layer opening that exposes the first surface of the cushion layer is defined, and a metal layer which is disposed on a first surface of the organic layer opposite to a second surface of the organic layer facing the cushion layer and in which a metal layer opening that overlaps the organic layer opening is defined, where each of the plurality of grooves may include the first surface of the cushion layer, the organic layer opening, and the metal layer opening.

According to an embodiment of the invention, an apparatus for attaching a cover panel including a cover central area which is flat, a cover outer area disposed outside the cover central area and bent, a light-blocking layer, and a groove layer which is disposed on the light-blocking layer and in which a plurality of grooves is defined in the cover central area includes a pad member faces the groove layer and to which a cover panel is disposed, a backlight member that irradiates light into the plurality of grooves, and a photographing member which faces the groove layer, and receives light reflected by the plurality of grooves to photograph positions of the plurality of grooves.

In an embodiment, each of the plurality of grooves may be adjacent to the cover outer area, the photographing member may include a first photographing member and a second photographing member, and the first photographing member may be spaced apart from the second photographing member.

In an embodiment, the apparatus for attaching a cover panel may further include a control member which aligns a position of the pad member based on information for photographed positions of the plurality of grooves and information for positions of the plurality of grooves set in advance.

In an embodiment, the plurality of grooves may include a first groove and a second groove spaced apart from each other, and the control member may obtain information for a position of the first groove, and then horizontally move the photographing member to obtain information for a position of the second groove.

In an embodiment, the pad member may rise to attach the cover panel to a display panel.

In an embodiment, the pad member may include silicone.

In an embodiment according to the invention, a method of attaching a cover panel includes disposing a cover panel to a pad member. The cover panel includes a cover central area that is flat, a cover outer area disposed outside the cover central area and bent, a light-blocking layer and a groove layer that is disposed on the light-blocking layer and faces the pad member and in which a plurality of grooves is defined in the cover central area, obtaining information for positions of the plurality of grooves by photographing the plurality of grooves, adjusting a position of the cover panel based on information for photographed positions of the plurality of grooves and information for positions of the plurality of grooves set in advance, and attaching the cover panel to a display panel such that the light-blocking layer faces the display panel.

In an embodiment, the obtaining the information for the positions of the plurality of grooves may include irradiating light from a backlight member into the plurality of grooves, and receiving, by a photographing member facing the groove layer, light reflected by the plurality of grooves to photograph the plurality of grooves.

In an embodiment, the plurality of grooves may include a first groove and a second groove spaced apart from each other, and the photographing the plurality of grooves may include photographing the first groove and then moving the photographing member to photograph the second groove.

In an embodiment, the plurality of grooves may include a third groove and a fourth groove spaced apart from each other, the photographing member may include a first photographing member and a second photographing member, and the photographing the plurality of grooves may include, while photographing the first groove by the first photographing member, photographing the third groove by the second photographing member, and while photographing the second groove by the first photographing member, photographing the fourth groove by the second photographing member.

In an embodiment, the attaching the cover panel to the display panel may include raising the pad member to attach the cover panel to the display panel.

In an embodiment, the groove layer may include a cushion layer disposed on the light-blocking layer, an organic layer which is disposed on a first surface of the cushion layer opposite to a second surface of the cushion layer facing the light-blocking layer and in which an organic layer opening that exposes the first surface of the cushion layer is defined, and a metal layer which is disposed on a first surface of the organic layer opposite to a second surface of the organic layer facing the cushion layer and in which a metal layer opening that overlaps the organic layer opening is defined, where each of the plurality of grooves may include the first surface of the cushion layer, the organic layer opening, and the metal layer opening.

In an embodiment, the display panel may include a central area and an outer area outside the central area and which is bent, and the outer area may include a first adjacent area adjacent to the central area in a first direction, a second adjacent area adjacent to the central area in a second direction crossing the first direction, and a corner area at least partially surrounding the first adjacent area, the central area, and the second adjacent area, where the first adjacent area, the second adjacent area, and the central area may be bent.

BRIEF DESCRIPTION OF THE DRAWINGS

The above and other features and advantages of embodiments of the invention will be more apparent from the following description taken in conjunction with the accompanying drawings, in which:

FIG. 2C is a cross-sectional view of the display apparatus, taken along line C-C' of FIG. 1;

FIG. 8C is a cross-sectional view of the cover panel, taken along line H-H' of FIG. 7;

FIGS. 11A to 11J are views showing an embodiment of a method of manufacturing a display apparatus;

DETAILED DESCRIPTION

Figure 1:
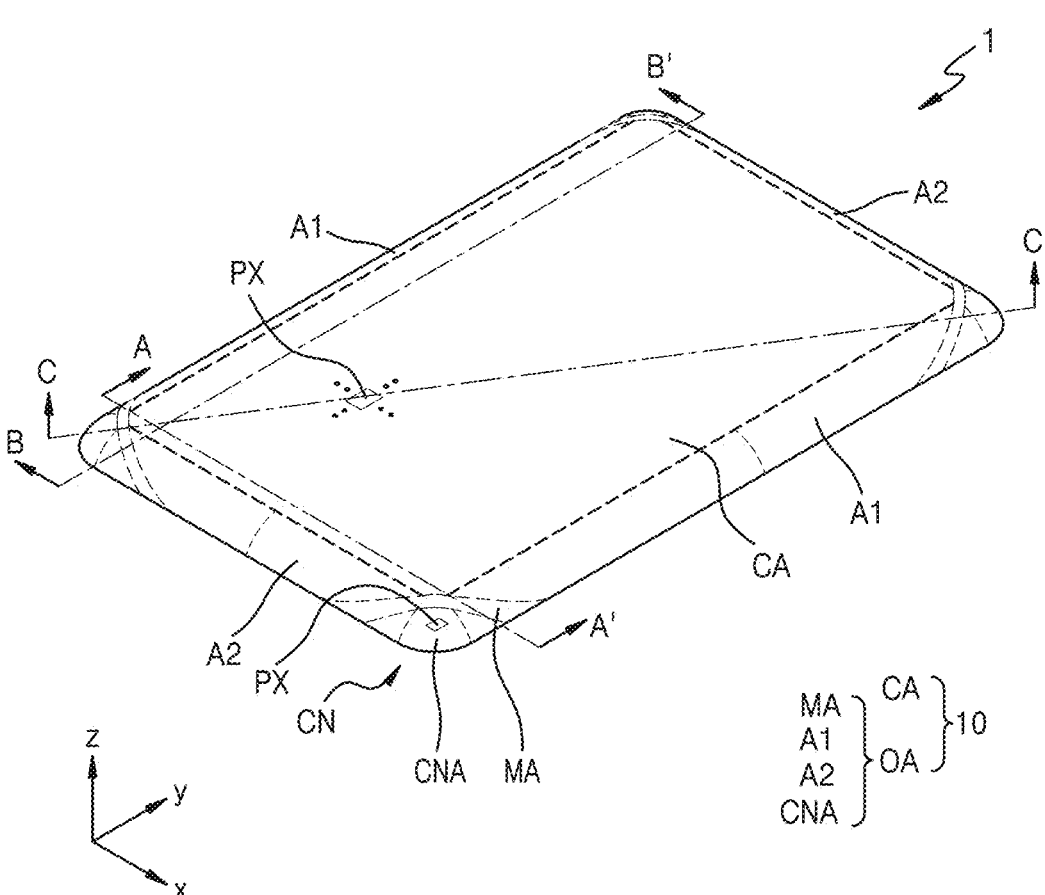
FIG. 1 is a perspective view of an embodiment of a display apparatus.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the invention, and methods for achieving them will be clarified with reference to embodiments described below in detail with reference to the drawings. However, the invention is not limited to the following embodiments and may be embodied in various forms.

Hereinafter, embodiments will be described with reference to the accompanying drawings, where like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, intervening layers, regions, or components, for example, may be present.

Sizes of elements in the drawings may be exaggerated or reduced for convenience of explanation. Since sizes and thicknesses of elements in the drawings are arbitrarily illustrated for convenience of explanation, for example, the invention is not limited thereto.

In the case where a certain embodiment may be implemented differently, a specific process order may be performed in the order different from the described order. Two processes that are successively described may be substantially simultaneously performed or performed in the order opposite to the order described, for example.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. It will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween, for example.

A display apparatus may be used as a display screen of various products including televisions, notebook computers, monitors, advertisement boards, Internet of things ("IoT") apparatuses as well as portable electronic apparatuses including mobile phones, smartphones, tablet personal computers, mobile communication terminals, electronic organizers, electronic books, portable multimedia players ("PMPs"), navigations, and ultra-mobile personal computers ("UMPCs"). In addition, the display apparatus may be used in wearable devices including smartwatches, watchphones, glasses-type displays, and head-mounted displays ("HMDs"). In addition, the display apparatus may be used as instrument panels for automobiles, center fascias for automobiles, or center information displays ("CIDs") arranged on a dashboard, room mirror displays that replace side mirrors of automobiles, and displays arranged on the backside of front seats as an entertainment for back seats of automobiles.

Figure 2A:
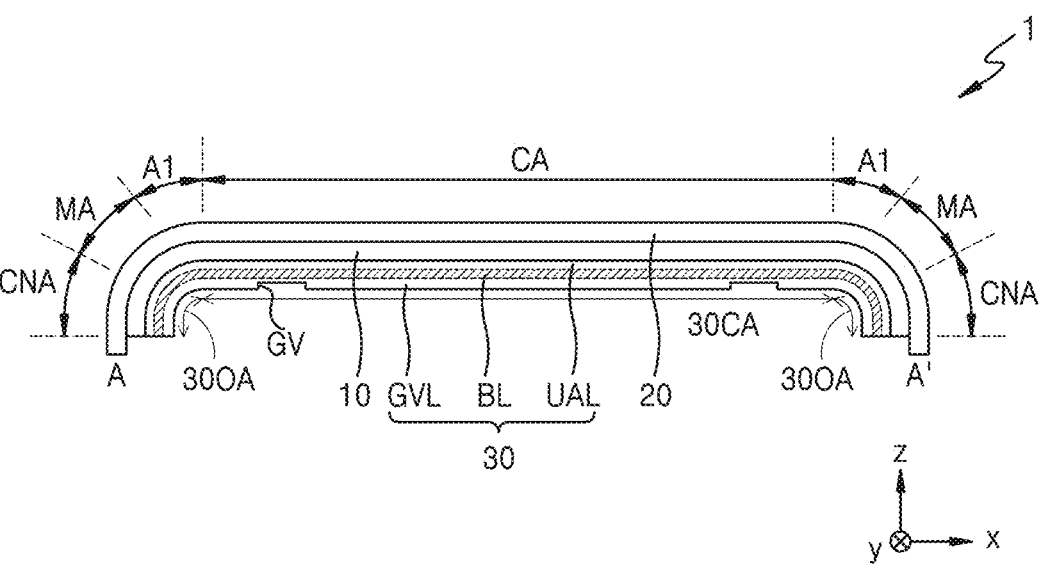
FIG. 2A is a cross-sectional view of the display apparatus, taken along line A-A' of FIG. 1.
Figure 2B:
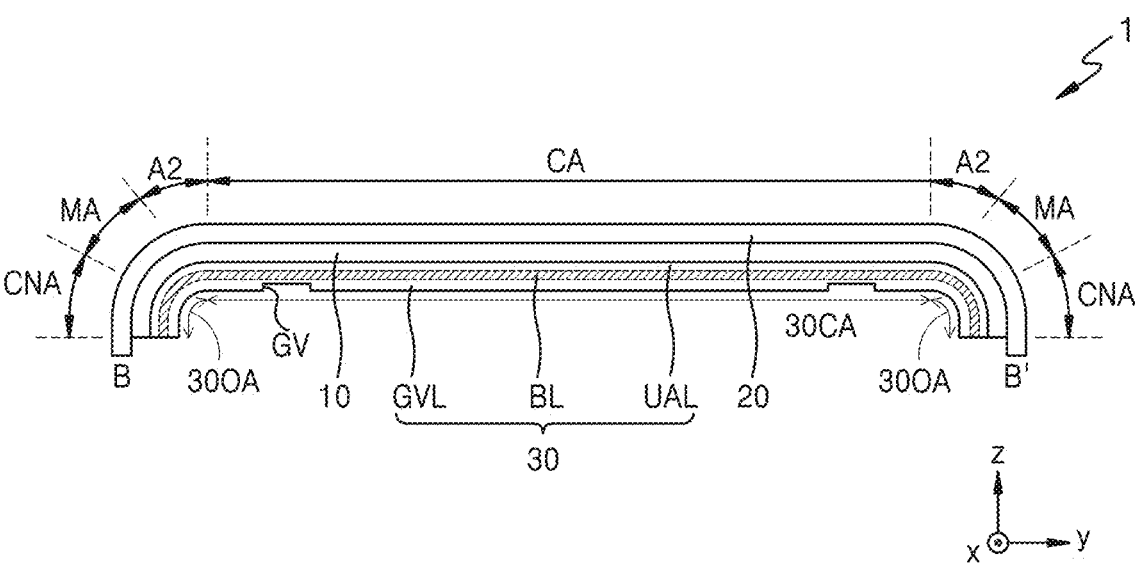
FIG. 2B is a cross-sectional view of the display apparatus, taken along line B-B' of FIG. 1.
Figure 2C:
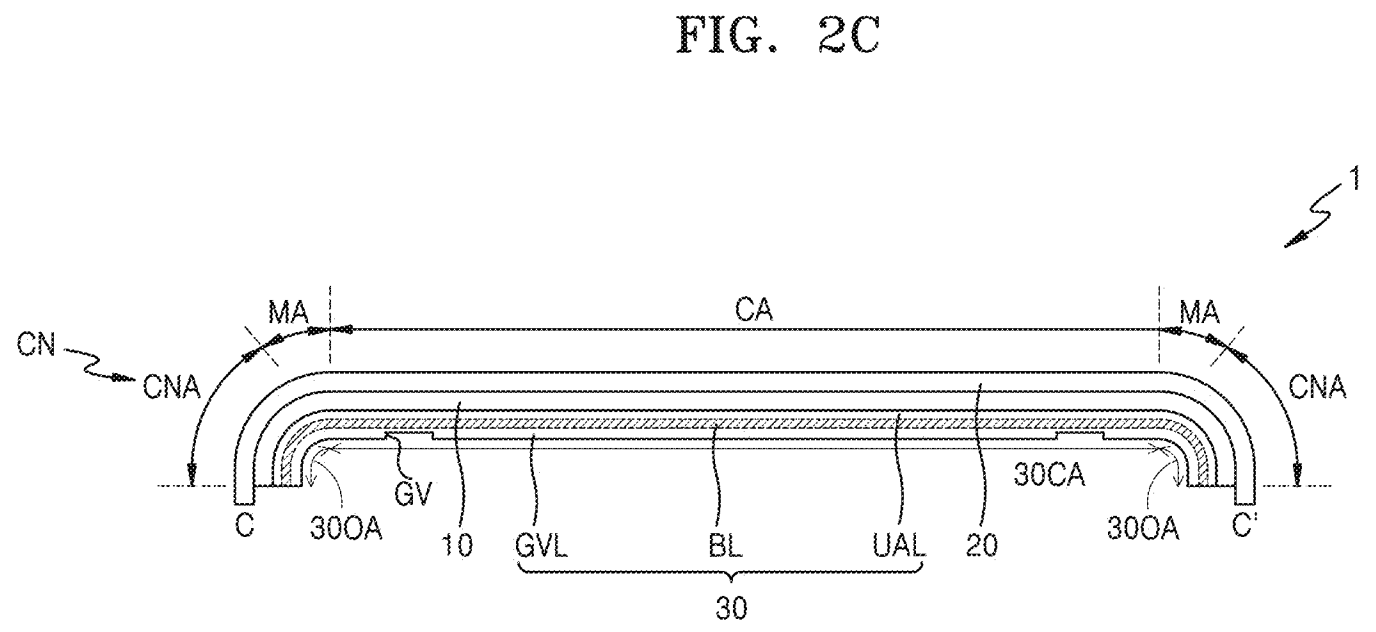

FIG. 1 is a perspective view of an embodiment of a display apparatus 1. FIG. 2A is a cross-sectional view of the display apparatus 1, taken along line A-A' of FIG. 1. FIG. 2B is a cross-sectional view of the display apparatus 1, taken along line B-B' of FIG. 1. FIG. 2C is a cross-sectional view of the display apparatus 1, taken along line C-C' of FIG. 1.

Referring to FIGS. 1 and 2A to 2C, the display apparatus 1 may display images. The display apparatus 1 may include an edge in a first direction and an edge in a second direction. Here, the first direction may cross the second direction. In an embodiment, the first direction and the second direction may define an acute angle. In another embodiment, the first direction and the second direction may define an obtuse angle or be perpendicular to each other. Hereinafter, the case where the first direction is perpendicular to the second direction is mainly described in detail. In an embodiment, the first direction may be an x direction or a −x direction, and the second direction may be a y direction or a −y direction.

The display apparatus 1 may include a display panel 10, a cover window 20, and a cover panel 30. The display panel 10 may display images by pixels PX. The display panel 10 may include a central area CA and an outer area OA. The central area CA may be flat. In an embodiment, the display apparatus 1 may display most of an image in the central area CA. A plurality of pixels PX may be arranged in the central area CA.

The outer area OA may be outside the central area CA. The outer area OA may surround at least a portion of the central area CA. In an embodiment, the outer area OA may surround an entirety of the central area CA. In an embodiment, the outer area OA may be bent. In an embodiment, the outer area OA may be bent around an axis extending in a first direction (e.g., an x direction or a −x direction), or bent around an axis extending in a second direction (e.g., a y direction or a −y direction). In an alternative embodiment, the outer area OA may be bent around an axis extending in a direction between the first direction (e.g., the x direction or the −x direction) and the second direction (e.g., the y direction or the −y direction) in a plan view. The plurality of pixels PX may be arranged in the outer area OA and may display images. In another embodiment, the pixels PX may not be arranged in the outer area OA and may not display images. Hereinafter, the case where the plurality of pixels PX is arranged in the outer area OA is mainly described in detail.

The outer area OA may include a first adjacent area A1, a second adjacent area A2, a corner area CNA, and an intermediate area MA. The first adjacent area A1 may be bent. The first adjacent area A1 may be adjacent to the central area CA in the first direction (e.g., the x direction or the −x direction). The first adjacent area A1 may be defined as a region bent from the central area CA in a cross-section (e.g., an xz cross-section) in the first direction (e.g., the x direction or the −x direction). The first adjacent area A1 may extend in the second direction (e.g., the y direction or the −y direction). In other words, the first adjacent area A1 may not be bent in a cross-section (e.g., an yz cross-section) in the second direction (e.g., the y direction or the −y direction). The first adjacent area A1 may be bent around an axis extending in the second direction (e.g., the y direction or the −y direction). Though it is shown in FIG. 2A that the first adjacent area A1 extending and bent in the x direction from the central area CA has the same curvature as that of the first adjacent area A1 extending and bent in the −x direction from the central area CA, the first adjacent area A1 extending and bent in the x direction from the central area CA and the first adjacent area A1 extending and bent in the −x direction from the central area CA may have different curvatures in another embodiment.

The second adjacent area A2 may be bent. The second adjacent area A2 may be adjacent to the central area CA in the second direction (e.g., the y direction or the −y direction). The second adjacent area A2 may be defined as a region bent from the central area CA in a cross-section (e.g., the yz cross-section) in the second direction (e.g., the y direction or the −y direction). The second adjacent area A2 may extend in the first direction (e.g., the x direction or the −x direction). In other words, the second adjacent area A2 may not be bent in a cross-section (e.g., the xz cross-section)

in the first direction (e.g., the x direction or the –x direction). The second adjacent area A2 may be bent around an axis extending in the first direction (e.g., the x direction or the –x direction). Though it is shown in FIG. 2B that the second adjacent area A2 extending and bent in the y direction from the central area CA has the same curvature as that of the second adjacent area A2 extending and bent in the –y direction from the central area CA, the second adjacent area A2 extending and bent in the y direction from the central area CA and the second adjacent area A2 extending and bent in the –y direction from the central area CA may have different curvatures in another embodiment.

The corner area CNA may be bent. In an embodiment, a corner CN where an edge of the display apparatus 1 in the first direction (e.g., the x direction or the –x direction) meets an edge of the display apparatus 1 in the second direction (e.g., the y direction or the –y direction) may have a preset curvature. The corner area CNA may be disposed in the corner CN. In an embodiment, the corner area CNA may be a region where the edge of the display apparatus 1 in the first direction (e.g., the x direction or the –x direction) meets the edge of the display apparatus 1 in the second direction (e.g., they direction or the –y direction). In an embodiment, the corner area CNA may surround at least a portion of the central area CA, the first adjacent area A1, and the second adjacent area A2. The corner area CNA may surround at least a portion of the central area CA, the first adjacent area A1, the second adjacent area A2, and the intermediate area MA. In the case where the first adjacent area A1 extends and is bent in the first direction (e.g., the x direction or the –x direction), and the second adjacent area A2 extends and is bent in the second direction (e.g., they direction or the –y direction), at least a portion of the corner area CNA may extend and be bent in the first direction (e.g., the x direction or the –x direction) and extend and be bent in the second direction (e.g., the y direction or the –y direction). In other words, at least a portion of the corner area CNA may be a multi-curved region where a plurality of curvatures in a plurality of directions overlaps one another. In an embodiment, the corner area CNA may be provided in plural.

The intermediate area MA may be disposed between the central area CA and the corner area CNA. In an embodiment, the intermediate area MA may extend between the first adjacent area A1 and the corner area CNA. In an embodiment, the intermediate area MA may extend between the second adjacent area A2 and the corner area CNA. In an embodiment, the intermediate area MA may be bent. In an embodiment, a driving circuit and/or a power wiring may be disposed in the intermediate area MA. The driving circuit may provide electric signals to the pixels, and the power wiring may provide power to the pixels. In this case, the pixels PX arranged in the intermediate area MA may overlap the driving circuit and/or the power wiring. In another embodiment, the driving circuit and/or the power wiring may not be arranged in the intermediate area MA. In this case, the pixels PX arranged in the intermediate area MA may not overlap the driving circuit and/or the power wiring.

In an embodiment, the corner area CNA and the intermediate area MA may be omitted. In other words, the outer area OA may only include the first adjacent area A1 and the second adjacent area A2. In another embodiment, the outer area OA may only include one of the first adjacent area A1 and the second adjacent area A2. In other words, the other one of the first adjacent area A1 and the second adjacent area A2, the corner area CNA, and the intermediate area MA may be omitted. Hereinafter, the case where the outer area OA includes the first adjacent area A1, the second adjacent area A2, the corner area CNA, and the intermediate area MA is mainly described in detail.

The pixel PX may be implemented by a display element. In an embodiment, the pixel PX may be provided in plural, and the plurality of pixels PX may display images by emitting light. In an embodiment, the plurality of pixels PX may each include a red sub-pixel, a green sub-pixel, and a blue sub-pixel. In an alternative embodiment, the plurality of pixels PX may each include a red sub-pixel, a green sub-pixel, a blue sub-pixel, and a white sub-pixel.

The pixels PX may be arranged in the central area CA. In an embodiment, the pixel PX may be disposed in one of the central area CA, the first adjacent area A1, the second adjacent area A2, the corner area CNA, and the intermediate area MA. In this case, the display apparatus 1 may display images in at least one of the central area CA, the first adjacent area A1, the second adjacent area A2, the corner area CNA, and the intermediate area MA. Accordingly, a display area, which is a region in the display apparatus 1 that displays images, may increase. In addition, because the outer area OA of the display apparatus 1 may be bent and display images, an aesthetic sense may be improved.

The cover window 20 may be disposed on the display panel 10. The cover window 20 may protect the display panel 10. In an embodiment, the cover window 20 may be flexible. The cover window 20 may be easily bent without cracking due to an external force or the like and protect the display panel 10. The cover window 20 may include glass, sapphire, or plastic. In an embodiment, the cover window 20 may include ultra-thin glass, or colorless polyimide, for example.

The display panel 10 may be attached to the cover window 20 by a transparent adhesive member such as an optically clear adhesive ("OCA").

The cover panel 30 may be disposed under the display panel 10. In other words, the display panel 10 may be disposed between the cover window 20 and the cover panel 30. The cover panel 30 may support and protect the display panel 10. The cover panel 30 may effectively dissipate heat occurring from the display panel 10. The cover panel 30 may include a cover central area 30CA and a cover outer area 30OA.

The cover central area 30CA may overlap the central area CA. The cover central area 30CA may be flat. The cover central area 30CA may extend along the central area CA.

The cover outer area 30OA may be disposed outside the cover central area 30CA. In an embodiment, the cover outer area 30OA may surround at least a portion of the cover central area 30CA. In an embodiment, the cover outer area 30OA may surround an entirety of the cover central area 30CA.

The cover outer area 30OA may extend along the outer area OA. In an embodiment, the cover outer area 30OA may be bent. In an embodiment, the cover outer area 30OA may be bent around an axis extending the first direction (e.g., the x direction or the –x direction), or bent around an axis extending the second direction (e.g., the y direction or the –y direction). In an alternative embodiment, the cover outer area 30OA may be bent around an axis extending in a direction between the first direction (e.g., the x direction or the –x direction) and the second direction (e.g., the y direction or the –y direction) in a plan view.

An upper adhesive layer UAL, a light-blocking layer BL, and a groove layer GVL may be stacked in the cover panel 30. In other words, the cover panel 30 may include the upper adhesive layer UAL, the light-blocking layer BL, and the groove layer GVL. The upper adhesive layer UAL may attach the cover panel 30 to the display panel 10. The upper adhesive layer UAL may be disposed between the display panel 10 and the light-blocking layer BL. The upper adhesive layer UAL may include at least one of an optical clear resin ("OCR"), an optical clear adhesive ("OCA"), and a pressure sensitive adhesive ("PSA"). In an embodiment, the upper adhesive layer UAL may be an embossed adhesive layer. A material of the embossed adhesive layer is not particularly limited, and adhesive materials widely known to those of ordinary skill in the art may be used. In an embodiment, various polymer resins may be used as the materials of the embossed adhesive layer.

The light-blocking layer BL may block light incident toward the display panel 10. The light-blocking layer BL may be disposed under the upper adhesive layer UAL. The light-blocking layer BL may be disposed in the cover central area 30CA and the cover outer area 30OA. In an embodiment, the light-blocking layer BL may overlap the central area CA and the corner area CNA. Accordingly, the light-blocking layer BL may prevent external light from being incident to the pixel PX of the display panel 10.

In an embodiment, the light-blocking layer BL may include at least one of black dye and black particles. In an embodiment, the light-blocking layer BL may include at least one of chrome (Cr), chrome oxide ($CrO_x$), and chrome nitride ($CrN_x$), or include a resin, graphite, non-Cr-based pigment, lactam-based pigment, and perylene-based pigment. Black organic pigment may include at least one of aniline black, lactam black, and perylene black. In an alternative embodiment, the light-blocking layer BL may be formed or provided by coating a material such as carbon or chrome.

The groove layer GVL may be disposed under the light-blocking layer BL. In an embodiment, the groove layer GVL may be disposed in the cover central area 30CA and the cover outer area 30OA. The groove layer GVL may include a plurality of functional layers. This will be further described below.

A plurality of grooves GV may be defined in the groove layer GVL. The plurality of grooves GV may each have a shape extending in a direction from the cover panel 30 to the display panel 10. The plurality of grooves GV may be defined in the cover central area 30CA. The plurality of grooves GV may serve as alignment marks. Since the plurality of grooves GV is defined in the cover central area 30CA that is flat, even though the outer area OA of the display panel 10 and the cover outer area 30OA of the cover panel 30 are bent, the positions of the plurality of grooves GV may not change. Accordingly, the plurality of grooves GV may serve as alignment marks for accurate alignment.

The plurality of grooves GV may overlap the light-blocking layer BL. In other words, even though the plurality of grooves GV is defined in the cover panel 30, the light-blocking layer BL may continuously extend in the cover central area 30CA and the cover outer area 30OA. Accordingly, the light-blocking layer BL may block external light from being incident to the central area CA and the outer area OA of the display panel 10.

Figure 3:
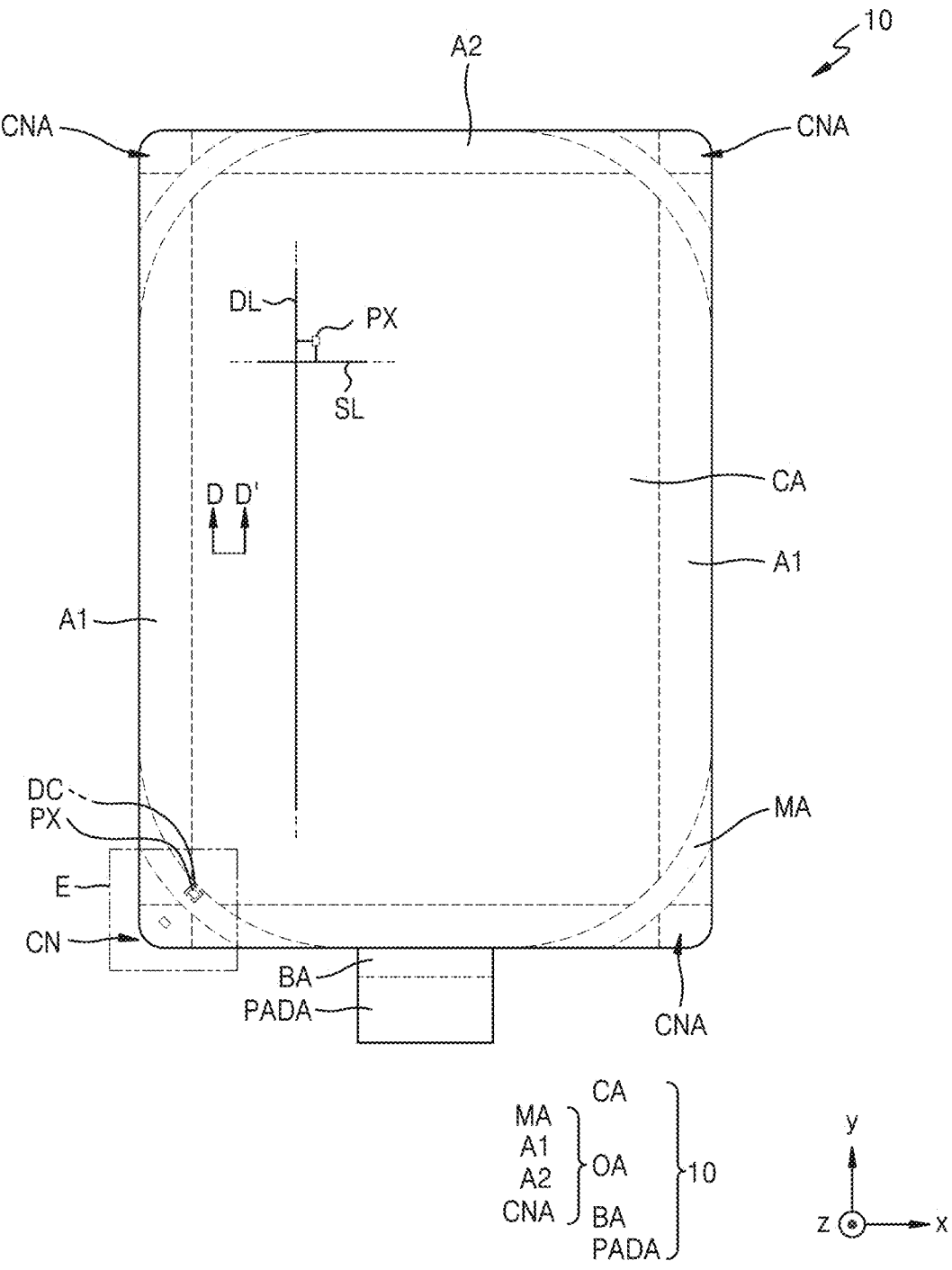
FIG. 3 is a plan view of an embodiment of a display panel.

FIG. 3 is a plan view of an embodiment of the display panel 10. FIG. 3 is a plan view of the display panel 10 that is unbent.

Referring to FIG. 3, the display panel 10 may display images. The display panel 10 may include the central area CA, the outer area OA, a bent area BA, and a pad area PADA. The central area CA may be flat. The display panel 10 may display most of an image in the central area CA. The plurality of pixels PX may be arranged in the central area CA.

The outer area OA may be outside the central area CA. The outer area OA may surround at least a portion of the central area CA. In an embodiment, the outer area OA may surround an entirety of the central area CA. The outer area OA may include the first adjacent area A1, the second adjacent area A2, a corner area CNA, and the intermediate area MA.

The first adjacent area A1 may be adjacent to the central area CA in the first direction (e.g., the x direction or the −x direction). The first adjacent area A1 may extend in the first direction (e.g., the x direction or the −x direction) from the central area CA.

The second adjacent area A2 may be adjacent to the central area CA in the second direction (e.g., the y direction or the −y direction). The second adjacent area A2 may extend in the second direction (e.g., the x direction or the −x direction) from the central area CA.

The corner area CNA may be disposed in the corner CN of the display panel 10. In an embodiment, the corner area CNA may be a region where the edge of the display panel 10 in the first direction (e.g., the x direction or the −x direction) meets the edge of the display panel 10 in the second direction (e.g., the y direction or the −y direction). In an embodiment, the corner area CNA and the intermediate area MA may surround at least a portion of the central area CA, the first adjacent area A1, and the second adjacent area A2. The corner area CNA may surround at least a portion of the central area CA, the first adjacent area A1, the second adjacent area A2, and the intermediate area MA.

The intermediate area MA may be disposed between the central area CA and the corner area CNA. In an embodiment, the intermediate area MA may extend between the first adjacent area A1 and the corner area CNA. In an embodiment, the intermediate area MA may extend between the second adjacent area A2 and the corner area CNA. In an embodiment, a driving circuit DC and/or a power wiring may be disposed in the intermediate area MA, the driving circuit DC providing electric signals to the pixels PX, and the power wiring providing power to the pixels PX. The pixel PX arranged in the intermediate area MA may overlap the driving circuit DC and/or the power wiring.

The bent area BA may be disposed outside the second adjacent area A2. In other words, the second adjacent area A2 may be disposed between the bent area BA and the central area CA. The display panel 10 may be bent in the bent area BA. In this case, the pad area PADA may face the backside of the display panel 10 opposite to the upper surface displaying images. Accordingly, the pad area PADA may not be viewed by a user.

The pad area PADA may be disposed outside the bent area BA. In other words, the bent area BA may be disposed between the second adjacent area A2 and the pad area PADA. A pad (not shown) may be disposed in the pad area PADA. The display panel 10 may receive electric signals and/or a power voltage through the pad.

The outer area OA may be bent. In an embodiment, at least one of the first adjacent area A1, the second adjacent area A2, the corner area CNA, and the intermediate area MA may be bent. In an embodiment, a portion of the first adjacent area A1 and the corner area CNA may be bent in a cross-section (e.g., the xz cross-section) in the first direction (e.g., the x direction or the −x direction). Another portion of the second adjacent area A2 and the corner area CNA may be bent in a cross-section (e.g., an yz cross-section) in the second direction (e.g., the y direction or the −y direction). Another portion of the corner area CNA may be bent in a cross-section (e.g., the xz cross-section) in the first direction (e.g., the x direction or the −x direction) and bent in a cross-section (e.g., the yz cross-section) in the second direction (e.g., the y direction or the −y direction).

The pixel PX may be disposed in one of the central area CA, the first adjacent area A1, the second adjacent area A2, the corner area CNA, and the intermediate area MA. In an embodiment, the pixel PX may include a display element. In an embodiment, the display element may be an organic light-emitting diode ("OLED") including an organic emission layer. In an alternative embodiment, the display element may be a light-emitting diode ("LED") including an inorganic emission layer. The size of the LED may be micro scale or nano scale. In an embodiment, the LED may be a micro LED. In an alternative embodiment, the LED may be a nanorod LED. The nanorod LED may include gallium nitride (GaN). In an embodiment, a color-converting layer may be disposed on the nanorod LED. The color-converting layer may include quantum dots. In an alternative embodiment, the display element may be a quantum-dot LED including quantum dots.

The pixel PX may include a plurality of sub-pixels. The plurality of sub-pixels may each emit light of a preset color by a display element. In the specification, the sub-pixel is a minimum unit implementing images and denotes an emission area. In the case where the OLED is employed as a display element, the emission area may be defined by an opening of a pixel-defining layer. This will be further described below.

The driving circuit DC may provide signals to each pixel PX. In an embodiment, the driving circuit DC may be a scan driving circuit providing scan signals to each pixel PX through a scan line SL. In an alternative embodiment, the driving circuit DC may be a data driving circuit providing data signals to each pixel PX through a data line DL. In an embodiment, the driving circuit DC may be disposed in the intermediate area MA. In this case, the pixel PX may overlap the driving circuit DC.

Figure 4:
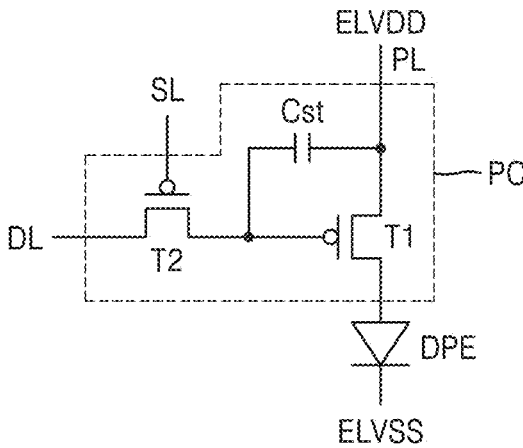
FIG. 4 is an equivalent circuit diagram of a pixel circuit applicable to a display panel.

FIG. 4 is an equivalent circuit diagram of a pixel circuit PC applicable to a display panel.

Referring to FIG. 4, the pixel circuit PC may be electrically connected to a display element DPE. The pixel circuit PC may include a driving thin-film transistor ("TFT") T1, a switching TFT T2, and a storage capacitor Cst. In an embodiment, the display element DPE may emit red, green, or blue light, or emit red, green, blue, or white light.

The switching TFT T2 is connected to the scan line SL and the data line DL, and transfers a data signal to the driving TFT T1 based on a scan signal input from the scan line SL. The data signal may be input from the data line DL.

The storage capacitor Cst may be connected to the switching TFT T2 and a driving voltage line PL and may store a voltage corresponding to a difference between a voltage transferred from the switching TFT T2 and a first power voltage ELVDD supplied to the driving voltage line PL.

The driving TFT T1 may be connected to the driving voltage line PL and the storage capacitor Cst and may control a driving current according to the voltage stored in the storage capacitor Cst, the driving current flowing from the driving voltage line PL to the display element DPE. The display element DPE may emit light having a preset brightness based on the driving current. An opposite electrode of the display element DPE may receive a second power voltage ELVSS.

Though it is shown in FIG. 4 that the pixel circuit PC includes two TFTs and one storage capacitor, the pixel circuit PC may include more TFTs.

Figure 5:
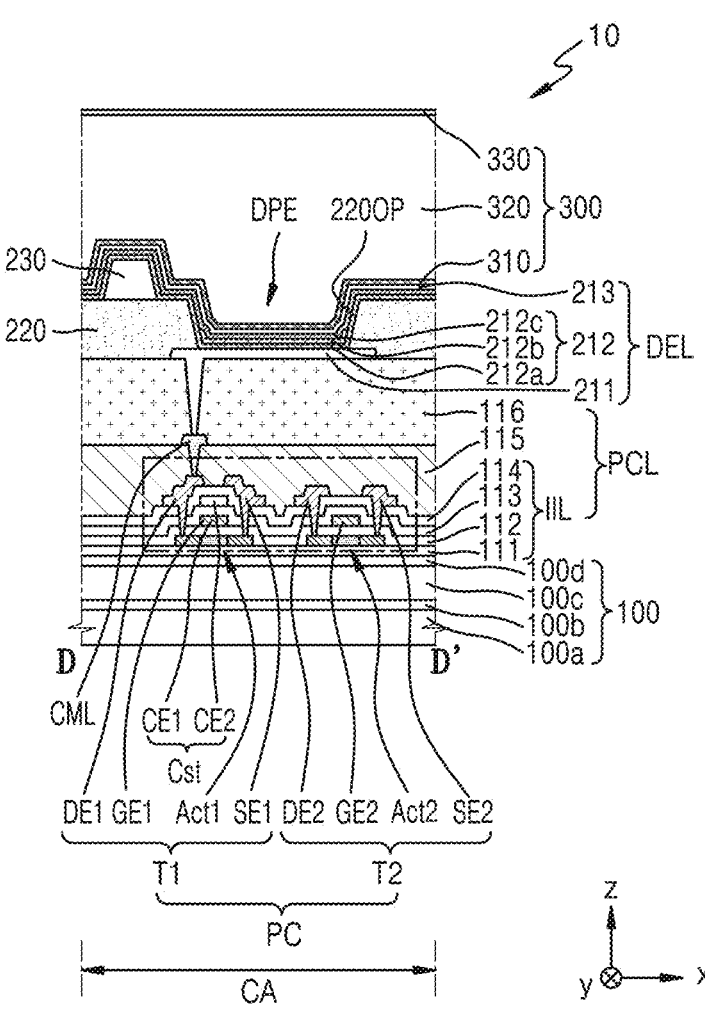
FIG. 5 is a cross-sectional view of the display panel, taken along line D-D' of FIG. 3.

FIG. 5 is a cross-sectional view of the display panel 10 of FIG. 3, taken along line D-D'.

Referring to FIG. 5, the display panel 10 may include a substrate 100, a pixel circuit layer PCL, a display element layer DEL, and an encapsulation layer 300. The substrate 100 may include the central area CA. In an embodiment, the substrate 100 may include a first base layer 100a, a first barrier layer 100b, a second base layer 100c, and a second barrier layer 100d. In an embodiment, the first base layer 100a, the first barrier layer 100b, the second base layer 100c, and the second barrier layer 100d may be sequentially stacked in the substrate 100. In another embodiment, the substrate 100 may include glass.

At least one of the first base layer 100a and the second base layer 100c may include a polymer resin such as polyethersulfone, polyarylate, polyetherimide, polyethylene naphthalate, polyethylene terephthalate, polyphenylene sulfide, polyimide, polycarbonate, cellulose tri acetate, cellulose acetate propionate, or the like.

The first barrier layer 100b and the second barrier layer 100d are barrier layers preventing the penetration of external foreign materials and may include a single layer or a multi-layer including an inorganic material such as silicon oxide ($SiO_2$), silicon nitride ($SiN_x$), and/or silicon oxynitride (SiON).

The pixel circuit layer PCL may be disposed on the substrate 100. The pixel circuit layer PCL may include the pixel circuit PC. The pixel circuit PC may be disposed d in the central area CA. The pixel circuit PC may include the driving TFT T1, the switching TFT T2, and the storage capacitor Cst. In an embodiment, the driving TFT T1 may include a first semiconductor layer Act1, a first gate electrode GE1, a first source electrode SE1, and a first drain electrode DE1. In an embodiment, the switching TFT T2 may include a second semiconductor layer Act2, a second gate electrode GE2, a second source electrode SE2, and a second drain electrode DE2. Since the second semiconductor layer Act2, the second gate electrode GE2, the second source electrode SE2, and the second drain electrode DE2 are respectively similar to the first semiconductor layer Act1, the first gate electrode GE1, the first source electrode SE1, and the first drain electrode DE1, detailed descriptions thereof are omitted.

The pixel circuit layer PCL may further include an inorganic insulating layer IIL, a first insulating layer 115, and a second insulating layer 116 arranged under and/or on elements of the pixel circuit PC. The inorganic insulating layer IIL may include a buffer layer 111, a first gate insulating layer 112, a second gate insulating layer 113, and an inter-insulating layer 114.

The buffer layer 111 may be disposed on the substrate 100. The buffer layer 111 may include an inorganic insulating material such as silicon nitride ($SiN_x$), silicon oxynitride (SiON), and silicon oxide ($SiO_2$), and include a single layer or a multi-layer including the inorganic insulating materials.

The first semiconductor layer Act1 may be disposed on the buffer layer 111. The first semiconductor layer Act1 may include polycrystalline silicon. In an alternative embodiment, the first semiconductor layer Act1 may include amorphous silicon, an oxide semiconductor, or an organic semiconductor. The first semiconductor layer Act1 may include a channel region, a drain region, and a source region, and the drain region and the source region may be disposed on two opposite sides of the channel region.

The first gate electrode GE1 may overlap the channel region. The first gate electrode GE1 may include a low-resistance metal material. The first gate electrode GE1 may include a conductive material including molybdenum (Mo), aluminum (Al), copper (Cu), and titanium (Ti) and have a single-layered structure or a multi-layered structure including the above materials.

The first gate insulating layer 112 between the first semiconductor layer Act1 and the first gate electrode GE1 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). In an embodiment, zinc oxide ($ZnO_x$) may be zinc oxide (ZnO) and/or zinc peroxide ($ZnO_2$).

The second gate insulating layer 113 may cover the first gate electrode GE1. Similar to the first gate insulating layer 112, the second gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$).

An upper electrode CE2 of the storage capacitor Cst may be disposed on the second gate insulating layer 113. The upper electrode CE2 may overlap the first gate electrode GE1. In this case, the first gate electrode GE1 of the driving TFT T1 and the upper electrode CE2 overlapping each other with the second gate insulating layer 113 therebetween may constitute the storage capacitor Cst. That is, the first gate electrode GE1 of the driving TFT T1 may serve as a lower electrode CE1 of the storage capacitor Cst. In other words, the storage capacitor Cst may overlap the driving TFT T1. In an embodiment, the storage capacitor Cst may not overlap the driving TFT T1. The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu), and include a single layer or a multi-layer including the above materials.

An inter-insulating layer 114 may cover the upper electrode CE2. The inter-insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The inter-insulating layer 114 may include a single layer or a multi-layer including the inorganic insulating material.

The first drain electrode DE1 and the first source electrode SE1 may each be disposed on the inter-insulating layer 114. The first drain electrode DE1 and the first source electrode SE1 may each include a material having high conductivity. The first drain electrode DE1 and the first source electrode SE1 may each include a conductive material including molybdenum (Mo), aluminum (Al), copper (Cu), and titanium (Ti) and have a single-layered structure or a multi-layered structure including the above materials. In an embodiment, the first drain electrode DE1 and the first source electrode SE1 may each have a multi-layered structure of Ti/Al/Ti.

The first insulating layer 115 may be disposed on the first drain electrode DE1, the first source electrode SE1, the second drain electrode DE2, the second source electrode SE2, and the inter-insulating layer 114. In an embodiment, the first insulating layer 115 may include an organic material. The first insulating layer 115 may include an organic insulating material including a general-purpose polymer such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination thereof.

A connection electrode CML may be disposed on the first insulating layer 115. The connection electrode CML may be electrically connected to the pixel circuit PC through a hole of the first insulating layer 115. In an embodiment, the connection electrode CML may be electrically connected to the first drain electrode DE1 or the first source electrode SE1. The connection electrode CML may include a material having high conductivity. The connection electrode CML may include a conductive material including molybdenum (Mo), aluminum (Al), copper (Cu), and titanium (Ti) and have a single-layered structure or a multi-layered structure including the above materials. In an embodiment, the connection electrode CML may have a multi-layered structure of Ti/Al/Ti.

The second insulating layer 116 may be disposed on the first insulating layer 115 and the connection electrode CML. In an embodiment, the second insulating layer 116 may include an organic material. The second insulating layer 116 may include an organic insulating material including a general-purpose polymer such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a combination thereof.

The display element layer DEL may be disposed on the pixel circuit layer PCL. The display element layer DEL may include a display element DPE, a pixel-defining layer 220, and a spacer 230. In an embodiment, the display element DPE may be an organic LED. The display element DPE may be electrically connected to the connection electrode CML through a hole of the second insulating layer 116. The display element DPE may include a pixel electrode 211, an intermediate layer 212, and an opposite electrode 213. In an embodiment, the display element DPE disposed in the central area CA may overlap the pixel circuit PC disposed in the central area CA.

The pixel electrode 211 may be disposed on the second insulating layer 116. The pixel electrode 211 may be electrically connected to the connection electrode CML through a hole of the second insulating layer 116. The pixel electrode 211 may include a conductive oxide such as indium tin oxide ("ITO"), indium zinc oxide ("IZO"), ZnO, indium oxide ($In_2O_3$), indium gallium oxide ("IGO"), or aluminum zinc oxide ("AZO"). In another embodiment, the pixel electrode 211 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a combination thereof. In another embodiment, the pixel electrode 211 may further include a layer on/under the reflective layer, and the layer may include ITO, IZO, ZnO, or $In_2O_3$.

An opening 220OP exposing the central portion of the pixel electrode 211 may be defined in the pixel-defining layer 220 and the pixel-defining layer 220 may be disposed on the pixel electrode 211. The opening 220OP may define an emission area of light emitted from the display element DPE. In an embodiment, the width of the opening 220OP may correspond to the width of the emission area. In addition, the width of the opening 220OP may correspond to the width of a sub-pixel.

In an embodiment, the pixel-defining layer 220 may include an organic insulating material. In another embodiment, the pixel-defining layer 220 may include an inorganic insulating material such as silicon nitride ($SiN_x$), silicon oxynitride (SiON), and silicon oxide ($SiO_2$). In another embodiment, the pixel-defining layer 220 may include an organic insulating material and an inorganic insulating material. In an embodiment, the pixel-defining layer 220 may include a light-blocking material and be provided in black. In an embodiment, the light-blocking material may include carbon black, carbon nanotubes, a resin or paste including black dye, metal particles including at least one of nickel, aluminum, molybdenum, and an alloy thereof, metal oxide particles (e.g., chrome oxide), or metal nitride particles (e.g., chrome nitride). In the case where the pixel-defining layer 220 includes a light-blocking material, external light reflection by a metal structure disposed below the pixel-defining layer 220 may be reduced.

The spacer 230 may be disposed on the pixel-defining layer 220. The spacer 230 may be structured to prevent destruction of the substrate 100 and/or a multi-layer on the substrate 100 in a method of manufacturing a display apparatus. In the method of manufacturing the display panel 10, a mask sheet may be used. In this case, the mask sheet may enter the inside of the opening 220OP of the pixel-defining layer 220 or be closely attached to the pixel-defining layer 220. The spacer 230 may prevent or reduce defects that a portion of the substrate 100 and the multi-layer is damaged or destroyed by the mask sheet while deposition materials are deposited on the substrate 100.

The spacer 230 may include an organic material such as polyimide. In an alternative embodiment, the spacer 230 may include an inorganic insulating material such as silicon nitride ($SiN_x$) or silicon oxide ($SiO_2$), or include an organic insulating material and an inorganic insulating material. In an embodiment, the spacer 230 may include a material different from that of the pixel-defining layer 220. In an alternative embodiment, in another embodiment, the spacer 230 may include the same material as that of the pixel-defining layer 220. In this case, the pixel-defining layer 220 and the spacer 230 may be simultaneously formed or provided during a mask process that uses a half-tone mask or the like.

The intermediate layer 212 may be disposed on the pixel-defining layer 220. The intermediate layer 212 may include an emission layer 212b disposed in the opening 220OP of the pixel-defining layer 220. The emission layer 212b may include a polymer organic material or a low-molecular weight organic material emitting light having a preset color.

The intermediate layer 212 may further include a first functional layer 212a and a second functional layer 212c, the first functional layer 212a may be disposed between the pixel electrode 211 and the emission layer 212b, and the second functional layer 212c may be disposed between the emission layer 212b and the opposite electrode 213. In an embodiment, the first functional layer 212a and the second functional layer 212c may be respectively disposed under and above the emission layer 212b. In an embodiment, the first functional layer 212a may include a hole transport layer ("HTL"), or include an HTL and a hole injection layer ("HIL"), for example. The second functional layer 212c may include an electron transport layer ("ETL") and/or an electron injection layer ("EIL"). Like the opposite electrode 213 described below, the first functional layer 212a and/or the second functional layer 212c may be common layers covering an entirety of the substrate 100.

The opposite electrode 213 may be disposed on the intermediate layer 212. The opposite electrode 213 may include a conductive material having a low work function. In an embodiment, the opposite electrode 213 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), or an alloy thereof. In an alternative embodiment, the opposite electrode 213 may further include a layer on the (semi) transparent layer, and the layer may include ITO, IZO, ZnO, or $In_2O_3$.

In an embodiment, a capping layer (not shown) may be further disposed on the opposite electrode 213. The capping layer may include lithium fluoride (LiF), an inorganic material, and/or an organic material.

The encapsulation layer 300 may be disposed on the opposite electrode 213. In an embodiment, the encapsulation layer 300 may include at least one inorganic encapsulation layer and at least one organic encapsulation layer. In an embodiment, the encapsulation layer 300 includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may each include at least one inorganic material among aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), and silicon nitride ($SiN_x$), silicon oxynitride (SiON). The organic encapsulation layer 320 may include a polymer-based material. The polymer-based material may include an acryl-based resin, an epoxy-based resin, polyimide, and polyethylene. In an embodiment, the organic encapsulation layer 320 may include acrylate.

A touch sensor layer may be disposed on the encapsulation layer 300. In an embodiment, the touch sensor layer may obtain coordinate information corresponding to an external input, e.g., a touch event.

An anti-reflection layer may be disposed on the touch sensor layer. The anti-reflection layer may reduce the reflectivity of light incident toward the display panel 10. In an embodiment, the anti-reflection layer may include a retarder and a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film.

In another embodiment, the anti-reflection layer may include a black matrix and color filters. The color filters may be arranged based on colors of pieces of light emitted respectively from the plurality of display elements DPE of the display panel 10. The color filters may each include red, green, or blue pigment or dye. In an alternative embodiment, the color filters may each further include quantum dots in addition to the pigment or dye. In an alternative embodiment, some of the color filters may not include the pigment or dye and may include scattering particles such as titanium oxide.

In addition, in another embodiment, the anti-reflection layer may include a destructive interference structure. The destructive interference structure may include a first reflection layer and a second reflection layer respectively disposed on different layers. First-reflected light and second-reflected light respectively reflected by the first reflection layer and the second reflection layer may destructively interfere and thus the reflectivity of external light may be reduced.

Figure 6:
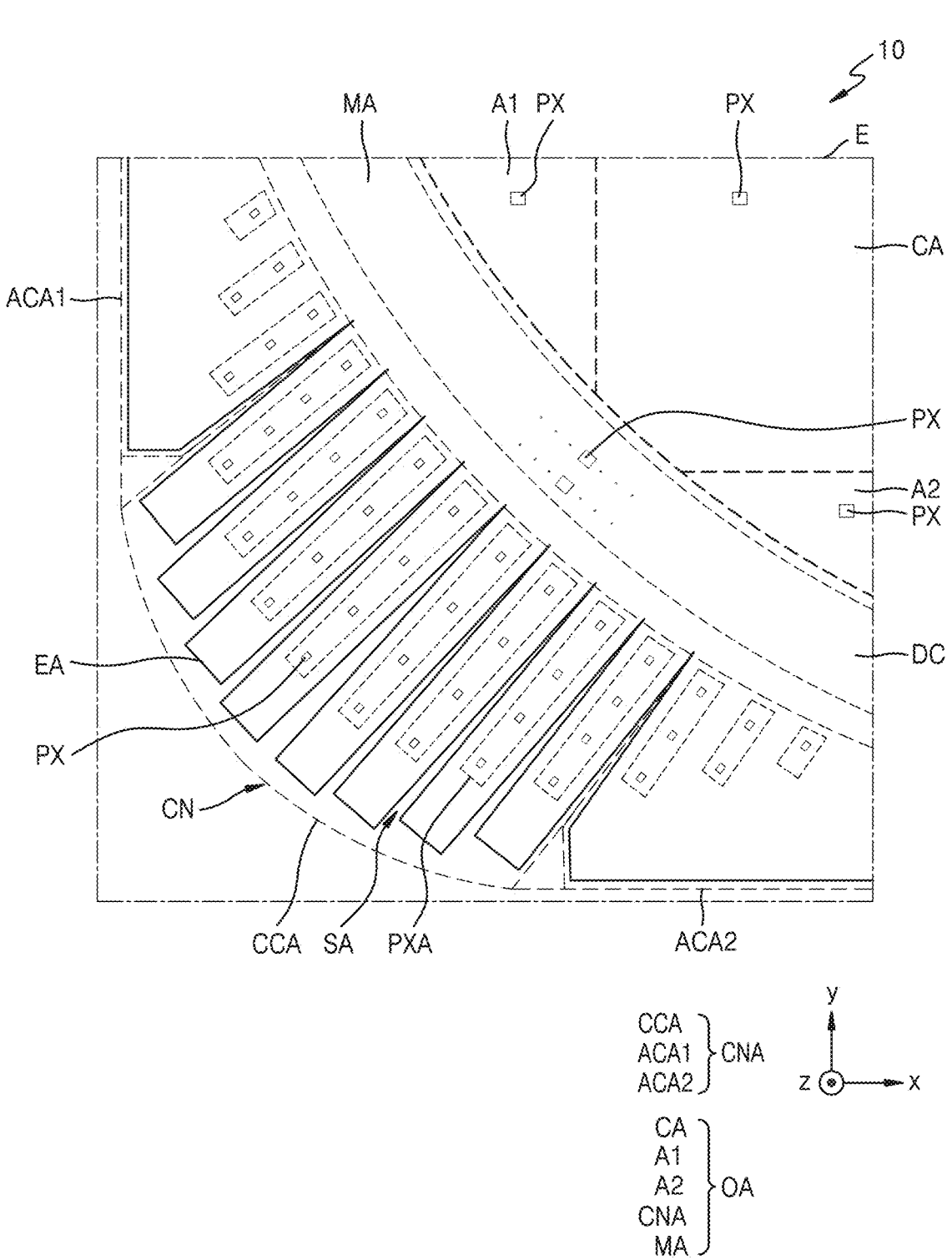
FIG. 6 is an enlarged view of region E of the display panel of FIG. 3.

FIG. 6 is an enlarged view of a region E of the display panel 10 of FIG. 3. In FIG. 6, the same reference numerals as those of FIG. 3 denote the same members, and thus, repeated descriptions thereof are omitted.

Referring to FIG. 6, the display panel 10 may include the central area CA and the outer area OA. The central area CA may be flat. The outer area OA may be outside the central area CA. The outer area OA may surround at least a portion of the central area CA. In an embodiment, the outer area OA may surround an entirety of the central area CA. The outer area OA may include the first adjacent area A1, the second adjacent area A2, a corner area CNA, and the intermediate area MA.

The first adjacent area A1 may be adjacent to the central area CA in the first direction (e.g., the x direction or the −x direction). The second adjacent area A2 may be adjacent to the central area CA in the second direction (e.g., the y direction or the −y direction).

The corner area CNA may be disposed in the corner CN of the display panel 10. In an embodiment, the corner area CNA may be a region where the edge of the display panel 10 in the first direction (e.g., the x direction or the −x direction) meets the edge of the display panel 10 in the second direction (e.g., the y direction or the −y direction). In an embodiment, the corner area CNA and the intermediate area MA may surround at least a portion of the central area CA, the first adjacent area A1, and the second adjacent area A2. The corner area CNA may surround at least a portion of the central area CA, the first adjacent area A1, the second adjacent area A2, and the intermediate area MA. The corner area CNA may include a central corner area CCA, a first adjacent corner area ACA1, and a second adjacent corner area ACA2.

The central corner area CCA may include an extension area EA. The extension area EA may extend in a direction away from the central area CA. In an embodiment, the extension area EA may be provided in plural. The plurality of extension areas EA may each extend in a direction away from the central area CA. In an embodiment, the extension areas EA may extend in a direction between the first direction (e.g., the x direction or the −x direction) and the second direction (e.g., the y direction or the −y direction) in a plan view.

A separation area SA may be defined between adjacent extension areas EA of the plurality of the extension areas EA. The separation area SA may be a region in which the elements of the display panel 10 are not arranged. While the central corner area CCA is bent in the corner CN, greater compressive strain than tensile strain may occur in the central corner area CCA. In the illustrated embodiment, because the separation area SA is defined between the extension areas EA adjacent to each other, the central corner area CCA may contract. Accordingly, the display panel 10 may be bent in the central corner area CCA without damage.

The first adjacent corner area ACA1 may be adjacent to the central corner area CCA. In an embodiment, at least a portion of the first adjacent area A1 and the first adjacent corner area ACA1 may be arranged in the first direction (e.g., the x direction or the −x direction). An end of the central corner area CCA and an end of the first adjacent corner area ACA1 adjacent to each other may be spaced apart from each other. The first adjacent corner area ACA1 is a region that is bent in a cross-section (e.g., an xz cross-section) in the first direction (e.g., the x direction or the −x direction) and is not bent in a cross-section (e.g., an yz cross-section) in the second direction (e.g., the y direction or the −y direction). The separation area SA may not be defined inside the first adjacent corner area ACA1.

The second adjacent corner area ACA2 may be adjacent to the central corner area CCA. At least a portion of the second adjacent area A2 may be disposed between the central area CA and the second adjacent corner area ACA2 in the second direction (e.g., the y direction or the −y direction). An end of the central corner area CCA and an end of the second adjacent corner area ACA2 adjacent to each other may be spaced apart from each other. The second adjacent corner area ACA2 is a region that is not bent in a cross-section (e.g., the xz cross-section) in the first direction (e.g., the x direction or the −x direction) and is bent in a cross-section (e.g., the yz cross-section) in the second direction (e.g., the y direction or the −y direction). The separation area SA may not be defined inside the second adjacent corner area ACA2.

The plurality of pixels PX may be arranged in the central area CA, the first adjacent area A1, the second adjacent area A2, the corner area CNA, and the intermediate area MA. Accordingly, the display panel 10 may display images in the central area CA, the first adjacent area A1, the second adjacent area A2, the corner area CNA, and the intermediate area MA. In an embodiment, the plurality of extension areas EA may each include a pixel area PXA, and the pixel PX may be disposed in the pixel area PXA. The plurality of pixels PX may be arranged in the extension direction of the plurality of extension areas EA.

The driving circuit DC may be disposed in the intermediate area MA. The driving circuit DC may be provided in plural. The plurality of driving circuits DC may be arranged in the extension direction of the intermediate area MA. The plurality of driving circuits DC may be arranged to surround at least a portion of the central area CA, the first adjacent area A1, and the second adjacent area A2. The plurality of pixels PX may be arranged in the intermediate area MA. Accordingly, even though the driving circuit DC is disposed in the intermediate area MA, the display panel 10 may display images in the intermediate area MA.

Figure 7:
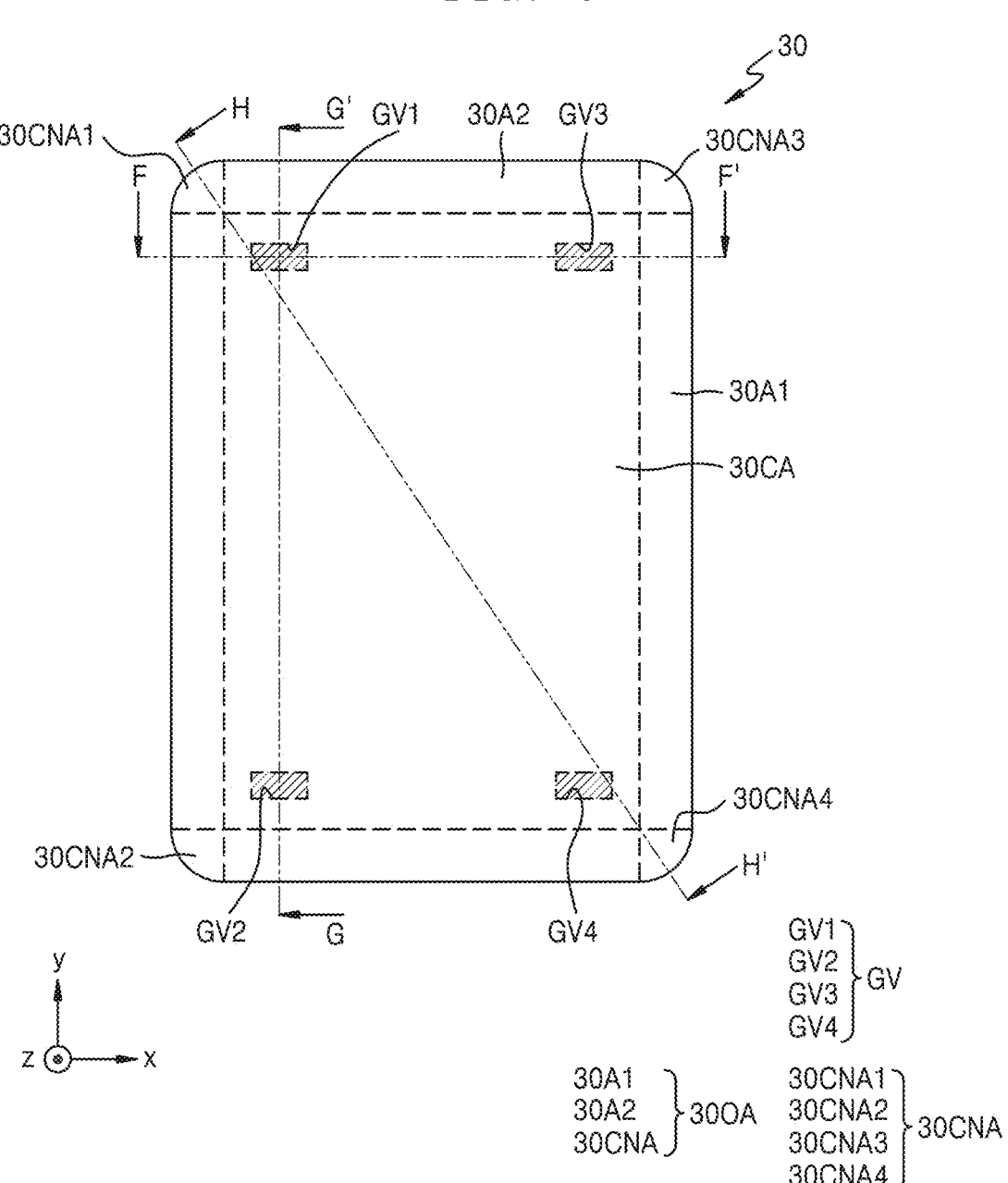
FIG. 7 is a plan view of an embodiment of a cover panel.
Figure 8A:
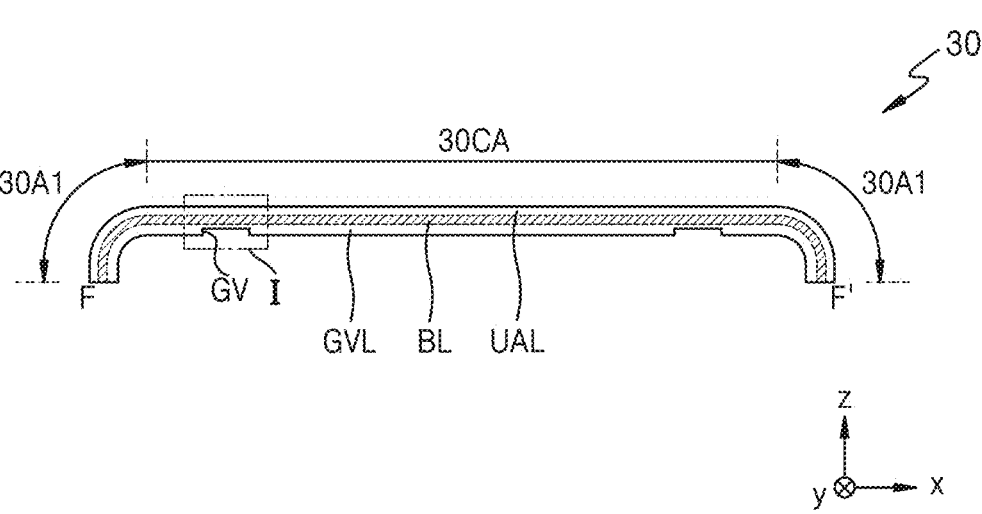
FIG. 8A is a cross-sectional view of the cover panel, taken along line F-F' of FIG. 7.
Figure 8B:
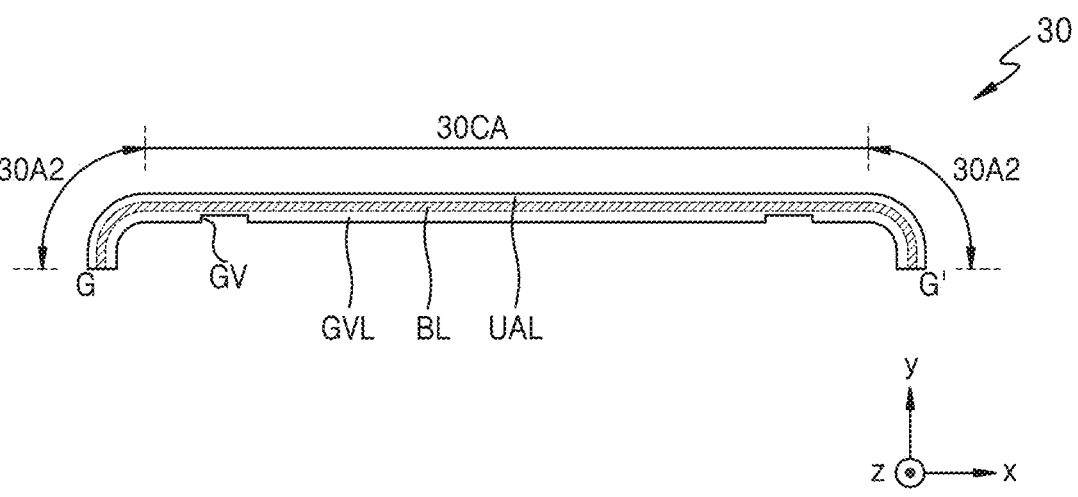
FIG. 8B is a cross-sectional view of the cover panel, taken along line G-G' of FIG. 7.
Figure 8C:
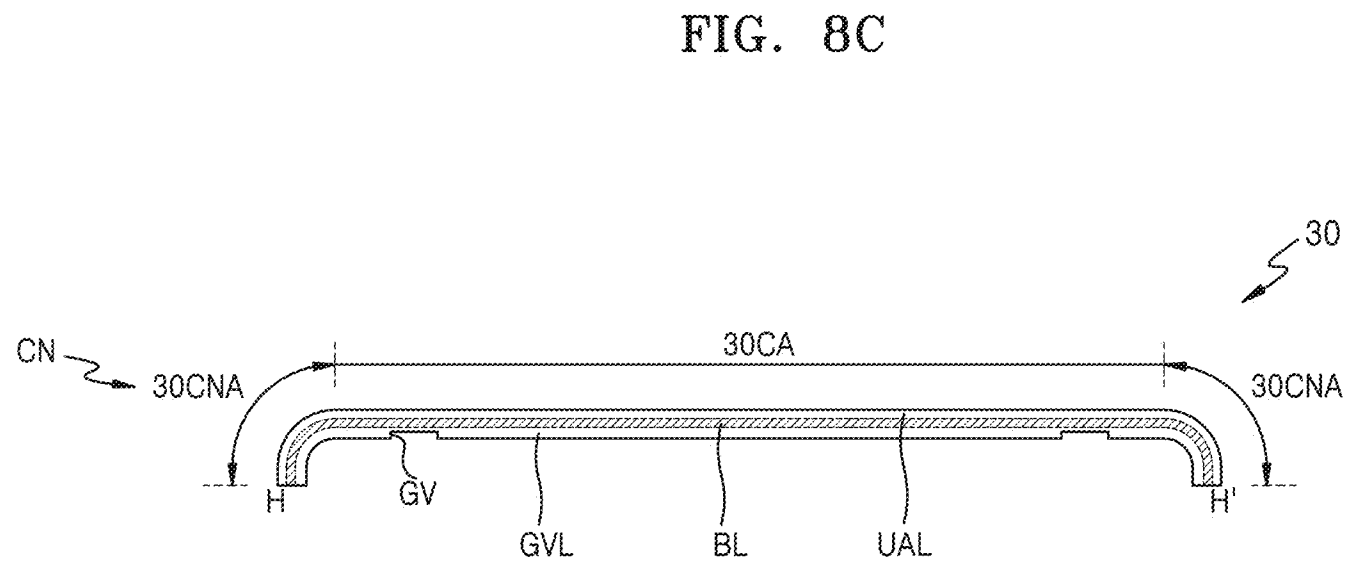

FIG. 7 is a plan view of an embodiment of the cover panel 30. FIG. 8A is a cross-sectional view of the cover panel 30, taken along line F-F' of FIG. 7. FIG. 8B is a cross-sectional view of the cover panel 30, taken along line G-G' of FIG. 7. FIG. 8C is a cross-sectional view of the cover panel 30, taken along line H-H' of FIG. 7.

Referring to FIGS. 7 and 8A to 8C, the cover panel 30 may include the cover central area 30CA and the cover outer area 30OA. The cover central area 30CA may be flat. In an embodiment, the cover central area 30CA may occupy most of the cover panel 30.

The cover outer area 30OA may be disposed outside the cover central area 30CA. The cover outer area 30OA may surround at least a portion of the cover central area 30CA. In an embodiment, the cover outer area 30OA may surround an entirety of the cover central area 30CA. In an embodiment, the cover outer area 30OA may be bent. In an embodiment, the cover outer area 30OA may be bent around an axis extending in the first direction (e.g., the x direction or the −x direction), or bent around an axis extending in the second direction (e.g., the y direction or the −y direction). In an alternative embodiment, the cover outer area 30OA may be bent around an axis extending in a direction between the first direction (e.g., the x direction or the −x direction) and the second direction (e.g., the y direction or the −y direction) in a plan view.

The cover outer area 30OA may include a first cover adjacent area 30A1, a second cover adjacent area 30A2, and a cover corner area 30CNA. The first cover adjacent area 30A1 may be bent. The first cover adjacent area 30A1 may be adjacent to the cover central area 30CA in the first direction (e.g., the x direction or the –x direction). The first cover adjacent area 30A1 may be defined as a region bent from the cover central area 30CA in a cross-section (e.g., the xz cross-section) in the first direction (e.g., the x direction or the –x direction). The first cover adjacent area 30A1 may extend in the second direction (e.g., the y direction or the –y direction). In other words, the first cover adjacent area 30A1 may not be bent in a cross-section (e.g., the yz cross-section) in the second direction (e.g., the y direction or the –y direction). The first cover adjacent area 30A1 may be a region bent around an axis extending in the second direction (e.g., the y direction or the –y direction). Though it is shown in FIG. 8A that the first cover adjacent area 30A1 extending and bent in the x direction from the cover central area 30CA may have the same curvature as that of the first cover adjacent area 30A1 extending and bent in the –x direction from the cover central area 30CA, the first cover adjacent area 30A1 extending and bent in the x direction from the cover central area 30CA may have a curvature different from that of the first cover adjacent area 30A1 extending and bent in the –x direction from the cover central area 30CA in another embodiment.

The second cover adjacent area 30A2 may be bent. The second cover adjacent area 30A2 may be adjacent to the cover central area 30CA in the second direction (e.g., the y direction or the –y direction). The second cover adjacent area 30A2 may be defined as a region bent from the cover central area 30CA in a cross-section (e.g., the yz cross-section) in the second direction (e.g., the y direction or the –y direction). The second cover adjacent area 30A2 may extend in the first direction (e.g., the x direction or the –x direction). In other words, the second cover adjacent area 30A2 may not be bent in a cross-section (e.g., the xz cross-section) in the first direction (e.g., the x direction or the –x direction). The second cover adjacent area 30A2 may be bent around an axis extending in the first direction (e.g., the x direction or the –x direction). Though it is shown in FIG. 8B that the second cover adjacent area 30A2 extending and bent in the y direction from the cover central area 30CA may have the same curvature as that of the second cover adjacent area 30A2 extending and bent in the –y direction from the cover central area 30CA, the second cover adjacent area 30A2 extending and bent in the y direction from the cover central area 30CA may have a curvature different from that of the second cover adjacent area 30A2 extending and bent in the –y direction from the cover central area 30CA in another embodiment.

The cover corner area 30CNA may be bent. The cover corner area 30CNA may be a region where the edge of the cover panel 30 in the first direction (e.g., the x direction or the –x direction) meets the edge of the cover panel 30 in the second direction (e.g., the y direction or the –y direction). In an embodiment, the cover corner area 30CNA may be disposed between the first cover adjacent area 30A1 and the second cover adjacent area 30A2. In the case where the first cover adjacent area 30A1 extends and is bent in the first direction (e.g., the x direction or the –x direction), and the second cover adjacent area 30A2 extends and is bent in the second direction (e.g., the y direction or the –y direction), at least a portion of the cover corner area 30CNA may extend and be bent in the first direction (e.g., the x direction or the –x direction) and extend and be bent in the second direction (e.g., the y direction or the –y direction). In an embodiment, the cover corner area 30CNA may be provided in plural.

The plurality of cover corner areas 30CNA may include a first cover corner area 30CNA1, a second cover corner area 30CNA2, a third cover corner area 30CNA3, and a fourth cover corner area 30CNA4. In an embodiment, the first cover corner area 30CNA1 may be an upper left cover corner area 30CNA. The second cover corner area 30CNA2 may be a lower left cover corner area 30CNA. The third cover corner area 30CNA3 may be an upper right cover corner area 30CNA. The fourth cover corner area 30CNA4 may be a lower right cover corner area 30CNA. The first cover corner area 30CNA1 may be spaced apart from the third cover corner area 30CNA3 in the first direction (e.g., the x direction or the –x direction). The second cover corner area 30CNA2 may be spaced apart from the fourth cover corner area 30CNA4 in the first direction (e.g., the x direction or the –x direction). The first cover corner area 30CNA1 may be spaced apart from the second cover corner area 30CNA2 in the second direction (e.g., the y direction or the –y direction). The third cover corner area 30CNA3 may be spaced apart from the fourth cover corner area 30CNA4 in the second direction (e.g., the y direction or the –y direction).

Though it is shown in FIG. 7 that the cover corner area 30CNA has a fan shape, the cover corner area 30CNA may have various shapes. In an embodiment, the cover corner area 30CNA may be omitted.

The upper adhesive layer UAL, the light-blocking layer BL, and the groove layer GVL may be stacked in the cover panel 30. In other words, the cover panel 30 may include the upper adhesive layer UAL, the light-blocking layer BL, and the groove layer GVL. The light-blocking layer BL may be disposed under the upper adhesive layer UAL. The light-blocking layer BL may block external light incident toward the display panel 10. The light-blocking layer BL may be disposed in the cover central area 30CA and the cover outer area 30OA. In an embodiment, the light-blocking layer BL may be disposed in the cover central area 30CA and the cover corner area 30CNA.

The groove layer GVL may be disposed under the light-blocking layer BL. In an embodiment, the groove layer GVL may be disposed in the cover central area 30CA and the cover outer area 30OA. A plurality of grooves GV may be defined in the groove layer GVL. The plurality of grooves GV may each have a shape extending in a direction from the groove layer GVL to the light-blocking layer BL. The plurality of grooves GV may be defined in the cover central area 30CA.

The plurality of grooves GV may each be adjacent to the cover outer area 30OA. The plurality of grooves GV may be spaced apart from each other. In an embodiment, the plurality of grooves GV may each be adjacent to the plurality of cover corner areas 30CNA. In an embodiment, the plurality of grooves GV may include a first groove GV1, a second groove GV2, a third groove GV3, and a fourth groove GV4. The first groove GV1 may be adjacent to the first cover corner area 30CNA1. The second groove GV2 may be adjacent to the second cover corner area 30CNA2. The third groove GV3 may be adjacent to the third cover corner area 30CNA3. The fourth groove GV4 may be adjacent to the fourth cover corner area 30CNA4. In an embodiment, an additional groove open from the cover corner area 30CNA to the outer side of the cover corner area 30CNA may be defined in the groove layer GVL.

Figure 9:
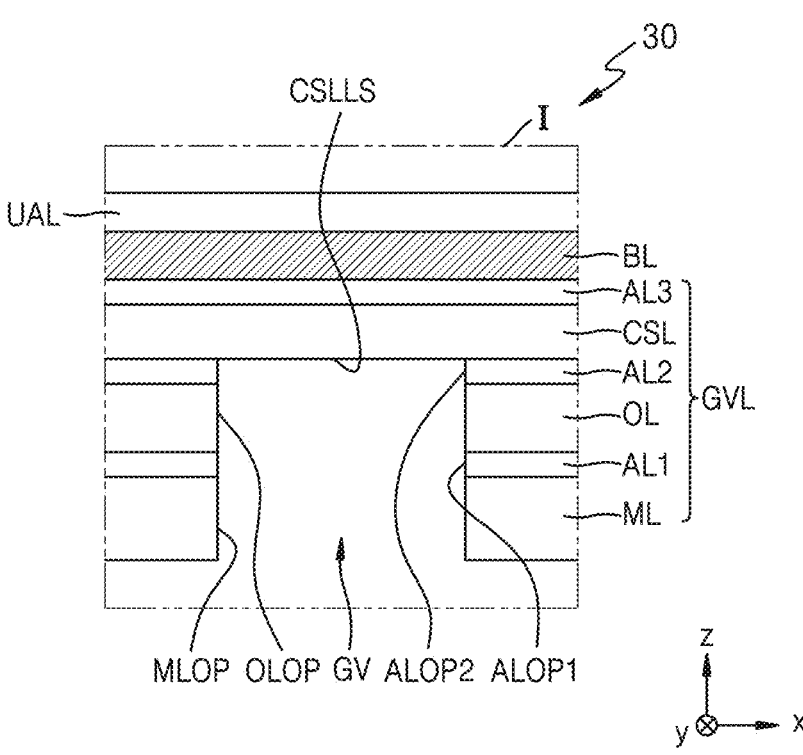
FIG. 9 is an enlarged view of region I of the cover panel of FIG. 8A.

FIG. 9 is an enlarged view of a region I of the cover panel 30 of FIG. 8A.

Referring to FIG. 9, the cover panel 30 may include the upper adhesive layer UAL, the light-blocking layer BL, and the groove layer GVL. In an embodiment, the groove layer GVL may include a cushion layer CSL, an organic layer OL, a metal layer ML, a first adhesive layer AL1, a second adhesive layer AL2, and a third adhesive layer AL3. In an embodiment, the metal layer ML, the first adhesive layer AL1, the organic layer OL, the second adhesive layer AL2, the light-blocking layer BL, and the upper adhesive layer UAL may be sequentially stacked.

The light-blocking layer BL may block incident of external light. In an embodiment, the light-blocking layer BL may include at least one of black dye and black particles.

The cushion layer CSL may be disposed below the light-blocking layer BL. The cushion layer CSL may perform a cushion function. In an embodiment, the cushion layer CSL may include a buffering member for absorbing external impacts. The buffering member may include a single layer or a multi-layer. In an embodiment, the buffering member may include a polymer resin such as polyurethane, polycarbonate, polypropylene, polyethylene, or the like, or include an elastic material such as rubber, a urethane-based material, a sponge foam-molded with an acryl-based material, or the like.

In an embodiment, the cushion layer CSL may be a synthetic resin foam including a matrix member and a plurality of pores. The matrix member may include a flexible material. In an embodiment, the matrix member may include a synthetic resin. The plurality of pores may easily absorb impacts. The plurality of pores may be defined as the cushion layer CSL has a porous structure. Accordingly, the plurality of pores may be dispersed in the matrix member. The plurality of pores may allow the shape of the cushion layer CSL to be easily performed. Accordingly, the plurality of pores may improve the impact resistance of the cover panel 30 by increasing the elasticity of the cushion layer CSL.

The organic layer OL may be disposed below the cushion layer CSL. The organic layer OL may include a synthetic resin film. In an embodiment, the organic layer OL may include a thermosetting resin. The organic layer OL may include at least one of polyimide-based resins, acrylic resins, methacrylic resins, polyisoprene, vinyl-based resins, epoxy-based resins, urethane-based resins, cellulose-based resins, siloxane-based resins, polyamide-based resins, and perylene-based resins.

The metal layer ML may be disposed below the organic layer OL. The metal layer ML may shield electromagnetic interference ("EMI") and/or dissipate heat. The metal layer ML may be a heat-dissipating member for efficiently dissipating heat. In an embodiment, the metal layer ML may include a metal material having high thermal conductivity such as copper, nickel, ferrite, silver, and aluminum.

The first adhesive layer AL1, the second adhesive layer AL2, and the third adhesive layer AL3 may each include at least one of an OCR, an OCA, and a PSA.

An organic layer opening OLOP exposing a lower surface CSLLS of the cushion layer CSL may be defined in the organic layer OL, and a metal layer opening MLOP overlapping the organic layer opening OLOP may be defied in the metal layer ML. In addition, a first adhesive layer opening ALOP1 and a second adhesive layer opening ALOP2 may be respectively defined in the first adhesive layer AU and the second adhesive layer AL2. In an embodiment, the plurality of grooves GV may each include the lower surface CSLLS of the cushion layer CSL, the organic layer opening OLOP, and the metal layer opening MLOP. In other words, the plurality of grooves GV may each be defined by the lower surface CSLLS of the cushion layer CSL, the organic layer opening OLOP, and the metal layer opening MLOP. In an embodiment, the plurality of grooves GV may each include the lower surface CSLLS of the cushion layer CSL, the first adhesive layer opening ALOP1, the organic layer opening OLOP, the second adhesive layer opening ALOP2, and the metal layer opening MLOP. Accordingly, the light-blocking layer BL may be spaced apart from the grooves GV and continuously extend, and tightly block incident of external light.

Hereinafter, a method of manufacturing a display apparatus is described.

Figure 10:
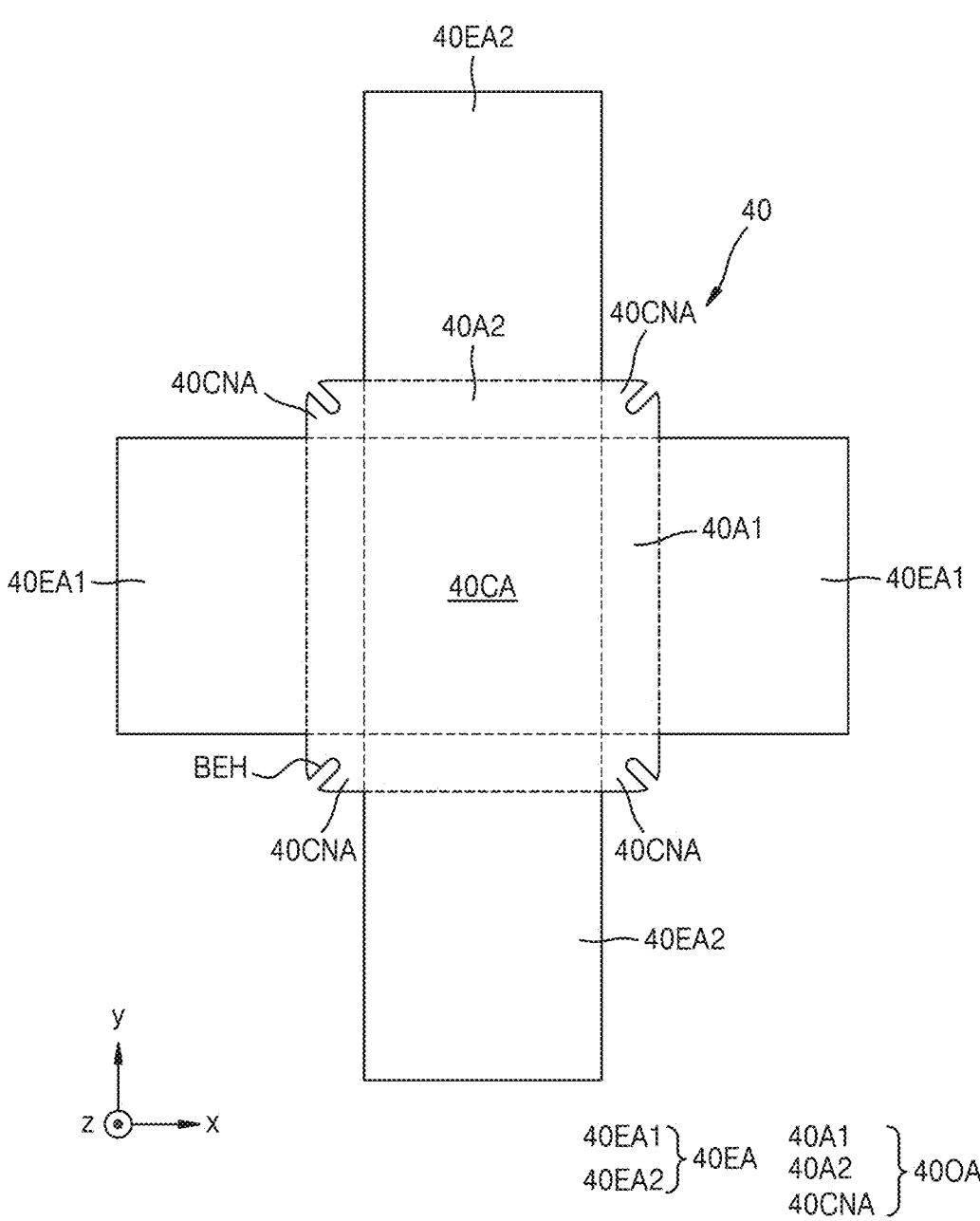
FIG. 10 is a plan view of an embodiment of a guide film.

FIG. 10 is a plan view of an embodiment of a guide film 40.

Referring to FIG. 10, the guide film 40 may be prepared. The guide film 40 may include a guide central area 40CA, a guide outer area 40OA, and a guide extension area 40EA. The guide outer area 40OA may be disposed outside the guide central area 40CA. The guide outer area 40OA may include a first guide adjacent area 40A1, a second guide adjacent area 40A2, and a guide corner area 40CNA.

The first guide adjacent area 40A1 may be adjacent to the guide central area 40CA in the first direction (e.g., the x direction or the −x direction). The second guide adjacent area 40A2 may be adjacent to the guide central area 40CA in the second direction (e.g., the y direction or the −y direction). The guide corner area 40CNA may be disposed between the first guide adjacent area 40A1 and the second guide adjacent area 40A2. In an embodiment, the guide corner area 40CNA may be provided in plural. In an embodiment, a cut groove BEH may be defined in the guide corner area 40CNA.

The guide extension area 40EA may extend from the guide outer area 40OA to the outside. In an embodiment, the guide extension area 40EA may include a first guide extension area 40EA1 and a second guide extension area 40EA2. The first guide extension area 40EA1 may extend from the first guide adjacent area 40A1 in the first direction (e.g., the x direction or the −x direction). The second guide extension area 40EA2 may extend from the second guide adjacent area 40A2 in the second direction (e.g., the y direction or the −y direction).

Though it is shown in FIG. 10 that the guide film 40 includes four guide extension areas 40EA, the guide film 40 is not limited thereto and may include a less or greater number of guide extension areas 40EA depending on the shape of the display panel. In addition, though it is shown in FIG. 10 that the shape of the guide extension area 40EA is a quadrangle in a plan view, the guide extension area 40EA may have various shapes including a polygon such as a triangle or the like, a portion of a circular shape, a portion of an elliptical shape, or the like.

FIGS. 11A to 11J are views showing an embodiment of a method of manufacturing a display apparatus.

Figure 11A:
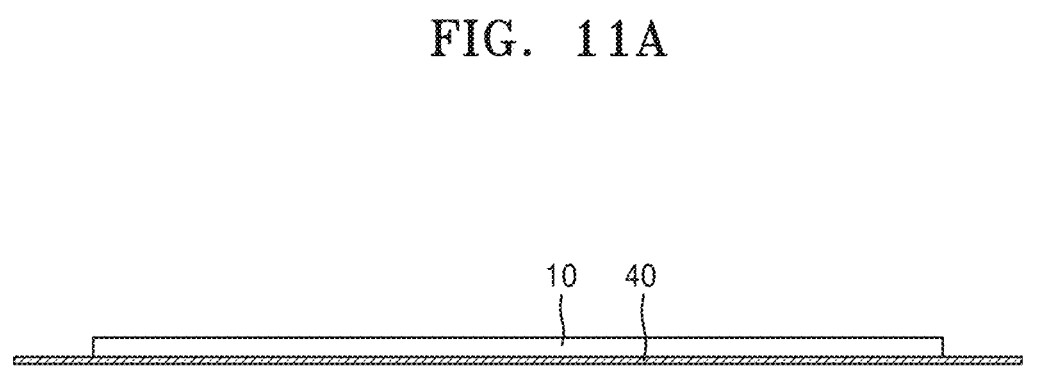

Referring to FIG. 11A, the display panel 10 may be disposed on the guide film 40. In an embodiment, a functional layer including an adhesive layer may be further disposed on/under the display panel 10. In an embodiment, when the display panel 10 is disposed on the guide film 40, the display panel 10 may correspond to the guide central area 40CA (refer to FIG. 10) and the guide outer area 40OA (refer to FIG. 10). In an embodiment, the central area CA (refer to FIG. 3) of the display panel 10 may overlap the guide central area 40CA of the guide film 40, and the outer area OA (refer to FIG. 3) of the display panel 10 may overlap the guide outer area 40OA. The guide extension area 40EA (refer to FIG. 10) may not overlap the display panel 10.

Figure 11B:
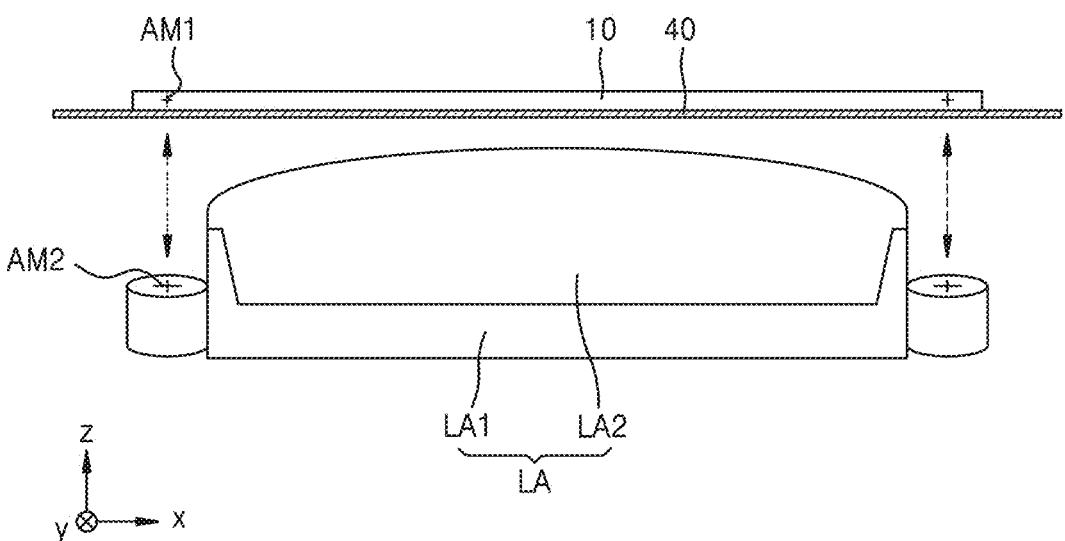

Referring to FIG. 11B, a lamination apparatus LA including a supporter LA1 and a volume change part LA2 on the supporter LA1 may be prepared. The supporter LA1 may support the volume change part LA2. The volume change part LA2 may include an air pump or be connected to an air pump. Since the volume change part LA2 has a low modulus, the shape and the volume of the volume change part LA2 may vary according to air pressure through the air pump. In an alternative embodiment, the volume change part LA2 may include a diaphragm.

The display panel 10 may be disposed on the lamination apparatus LA such that the backside of the display panel 10 faces the lamination apparatus LA. In other words, the guide film 40 may be disposed on the lamination apparatus LA. The guide film 40 may be disposed between the display panel 10 and the lamination apparatus LA.

Next, the display panel 10 may be aligned with the lamination apparatus LA. In an embodiment, the display panel 10 may be aligned with the lamination apparatus LA such that a first alignment mark AM1 marked on the display panel 10 coincides with a second alignment mark AM2 marked on the lamination apparatus LA.

Figure 11C:
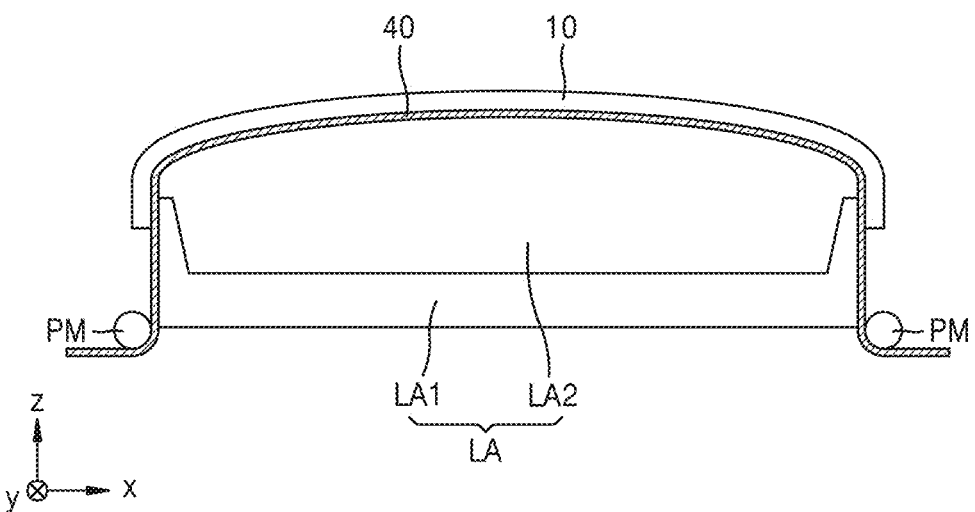
Figure 11D:
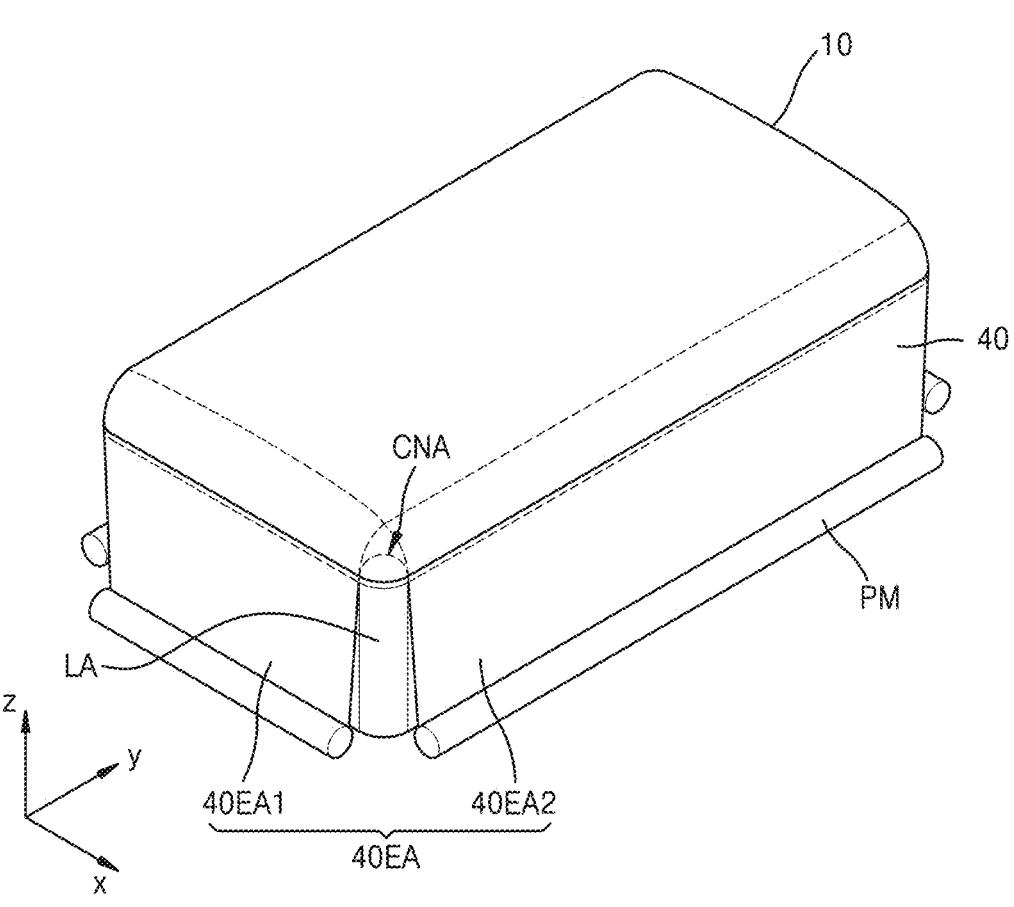

Referring to FIGS. 11C and 11D, the display panel 10 may be preliminarily formed or provided by the guide film 40. In an embodiment, the shape of the display panel 10 may be transformed by applying external force, e.g., tensile force to the guide film 40.

Specifically, the guide film 40 may be disposed (e.g., seated) on the lamination apparatus LA. A push member PM may be disposed on the guide film 40. The guide film 40 may be closely attached on the lateral surface of the lamination apparatus LA by the push member PM. In an embodiment, when the push members PM respectively press the first guide extension area 40EA1 and the second guide extension area 40EA2 of the guide film 40, tensile force is applied to the guide film 40, and thus, the guide film 40 may be transformed along the outer surface of the lamination apparatus LA. In addition, the display panel 10 disposed on the guide film 40 may be bent.

Figure 11E:
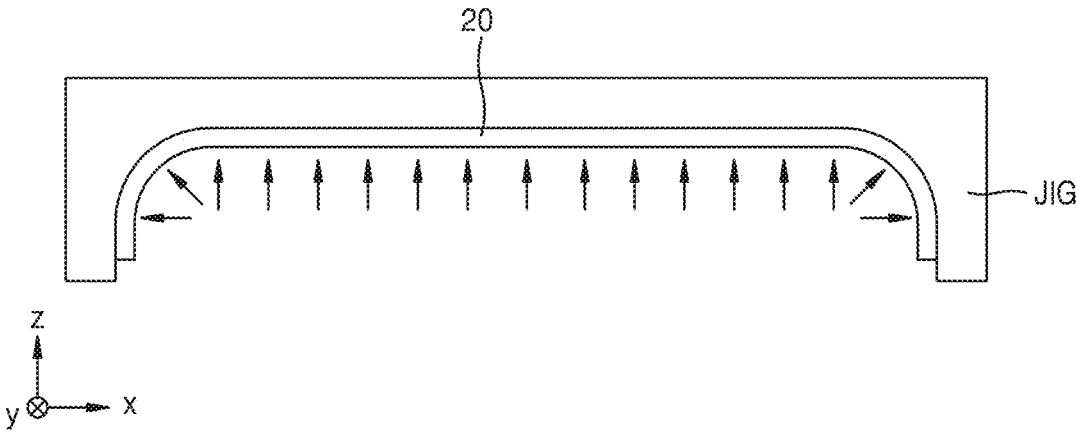

Referring to FIG. 11E, the cover window 20 may be prepared. In an embodiment, a jig JIG including an indented surface corresponding to the final shape of the cover window 20 may transform the cover window 20 to have a flat surface and a curved surface. In other words, the jig JIG may be a frame having the shape of the display apparatus to be finally manufactured. The cover window 20 may be transformed according to the shape of the indented surface of the jig JIG by closely attaching the cover window 20 to the indented surface of the jig JIG.

Figure 11F:
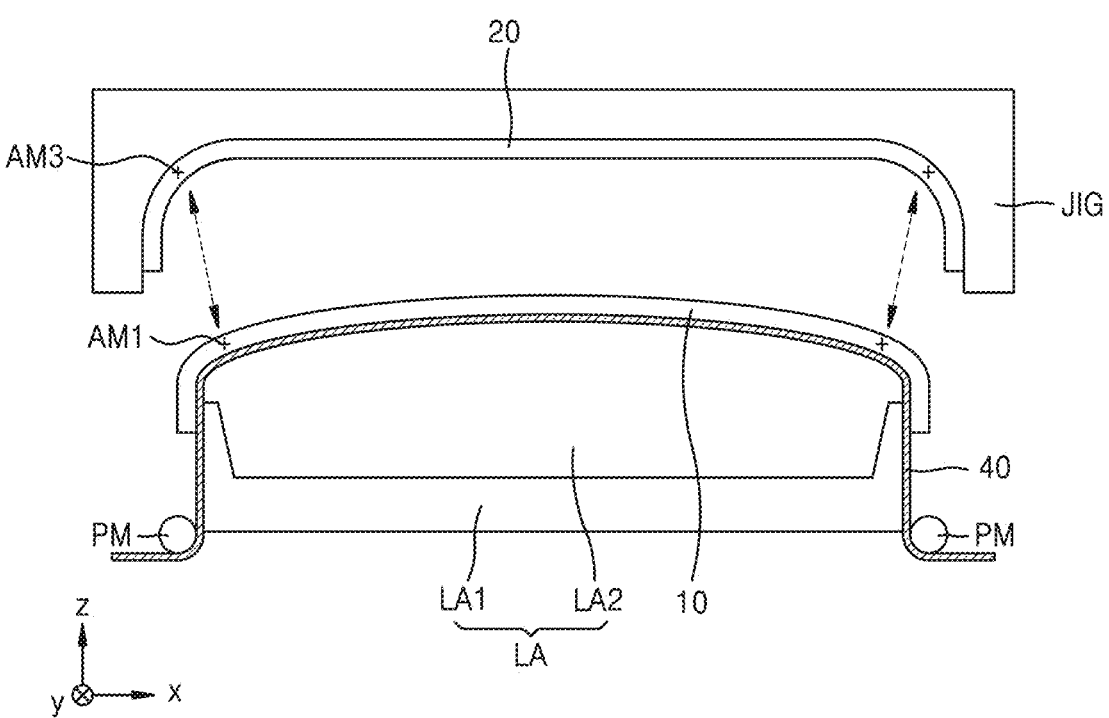

Referring to FIG. 11F, the display panel 10 is preliminarily formed or provided, and then, the display panel 10 may be disposed such that the cover window 20 faces the front surface of the display panel 10. In other words, the cover window 20 may be disposed on the display panel 10. Next, the display panel 10 may be aligned with the cover window 20. In an embodiment, the display panel 10 may be aligned with the cover window 20 such that the first alignment mark AM1 marked on the display panel 10 coincides with a third alignment mark AM3 marked on the cover window 20.

Next, the display panel 10 may be attached to the cover window 20.

Figure 11G:
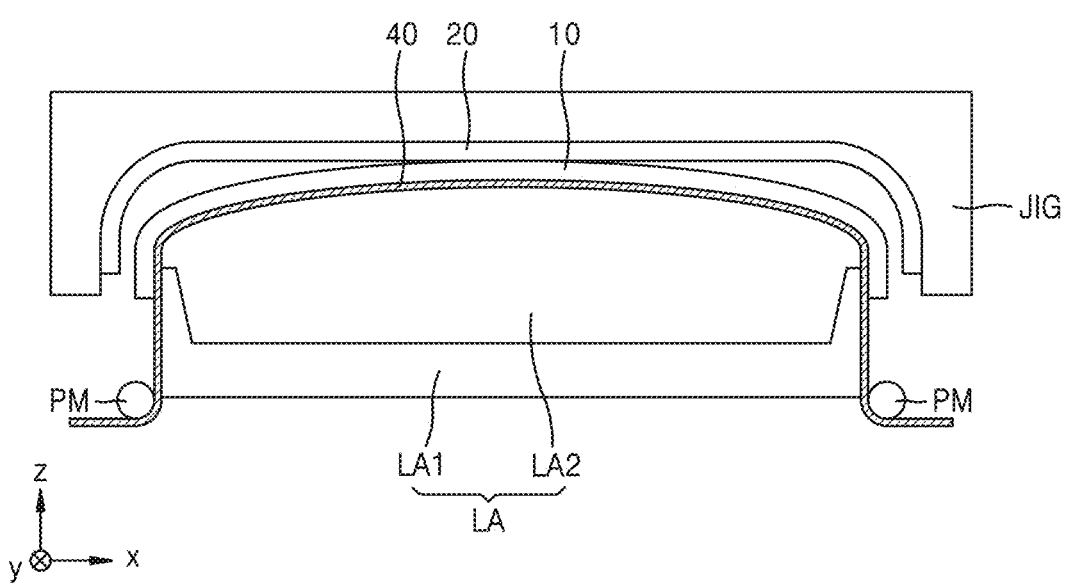
Figure 11H:
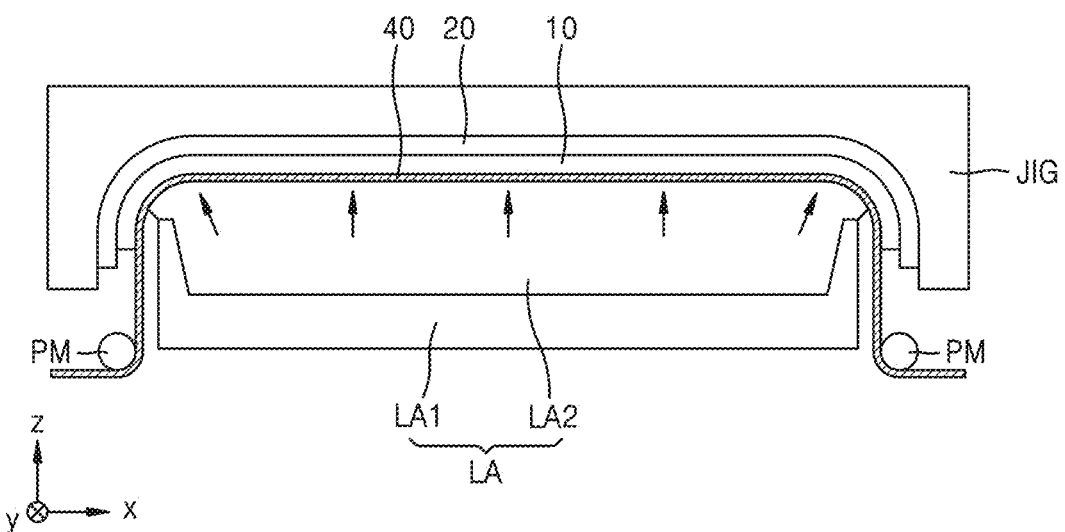

Referring to FIGS. 11G and 11H, the cover window 20 may be attached to the front surface of the display panel 10. In an embodiment, as shown in FIG. 11G, a portion of the display panel 10 may be attached to the cover window 20 first. In an embodiment, a flat surface (e.g., the central area) having no curvature in the final shape of the display panel 10 may be attached to the cover window 20 first.

Next, as shown in FIG. 11H, as the shape of the volume change part LA2 of the lamination apparatus LA changes and the volume thereof increases, the remaining portions of the display panel 10, e.g., the outer area, may be attached to the cover window 20.

In an embodiment, processes of attaching the first adjacent area, the second adjacent area, and the corner area of the display panel 10 to the cover window 20 may be simultaneously performed. In an embodiment, while the first adjacent area and the second adjacent area are attached to the cover window 20, the corner area may naturally contact and attach to the cover window 20 due to peripheral external force. In another embodiment, at least one of the first adjacent area, the second adjacent area, and the corner area of the display panel 10 is attached to the cover window 20, and another of the first adjacent area, the second adjacent area, and the corner area of the display panel 10 may be attached to the cover window 20.

Figure 11I:
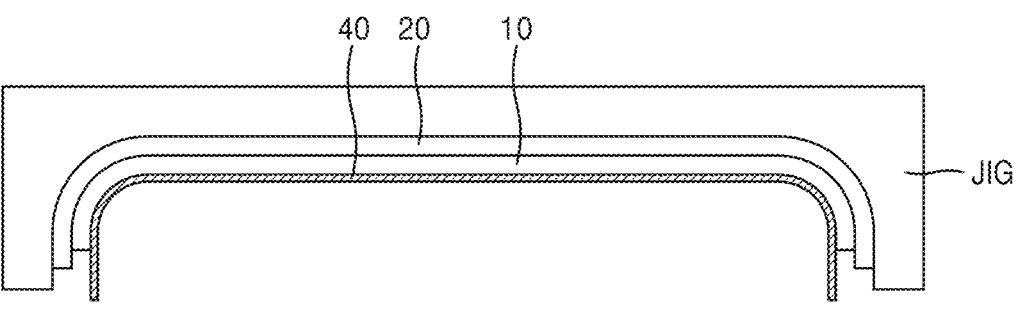
Figure 11I:
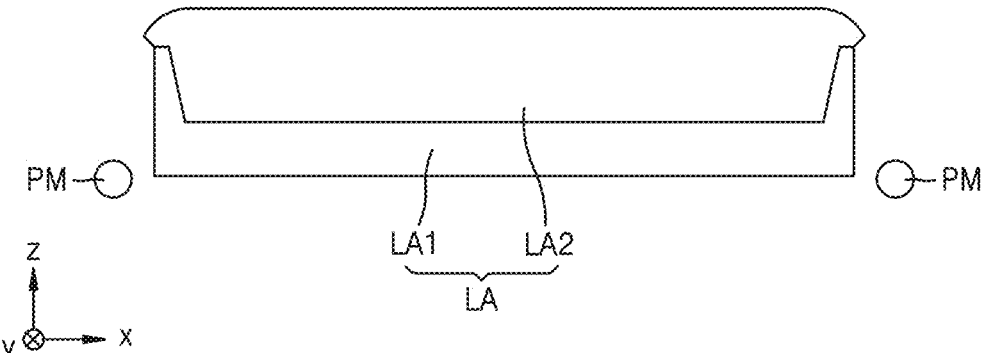

Referring to FIG. 11I, after an operation of attaching the display panel 10 to the cover window 20 is performed, the lamination apparatus LA may be removed from the display panel 10 to which the cover window 20 is attached.

Figure 11J:
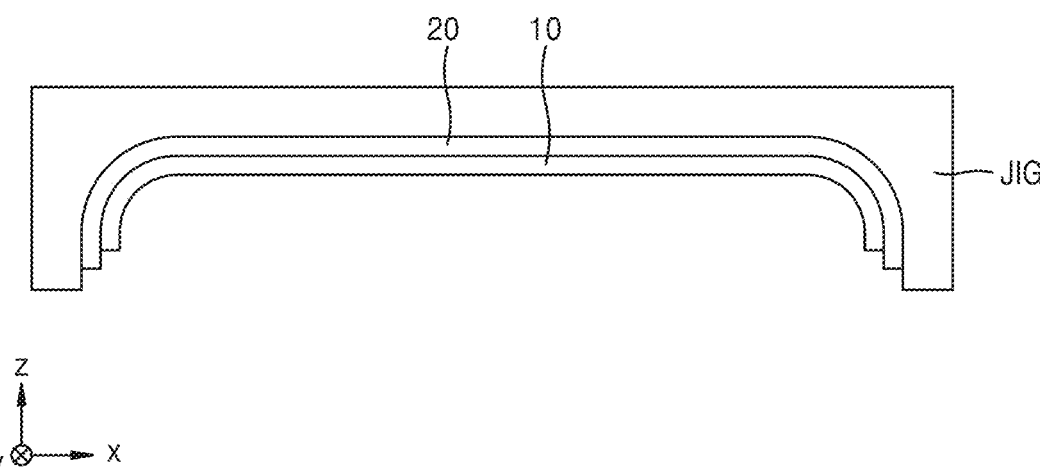

Referring to FIG. 11J, the guide film 40 may be removed. In an embodiment, the guide film 40 may be removed by irradiating an ultraviolet ray. In an embodiment, a process of removing the guide film 40 may be omitted.

Next, an operation of hardening the display panel 10 and the cover window 20 may be performed. In an embodiment, an ultraviolet ray may be irradiated to display panel 10 and the cover window 20. When an ultraviolet ray is irradiated to the display panel 10 and the cover window 20, bubbles or the like may come out from an adhesive member or the like attached to the display panel 10.

Figure 12:
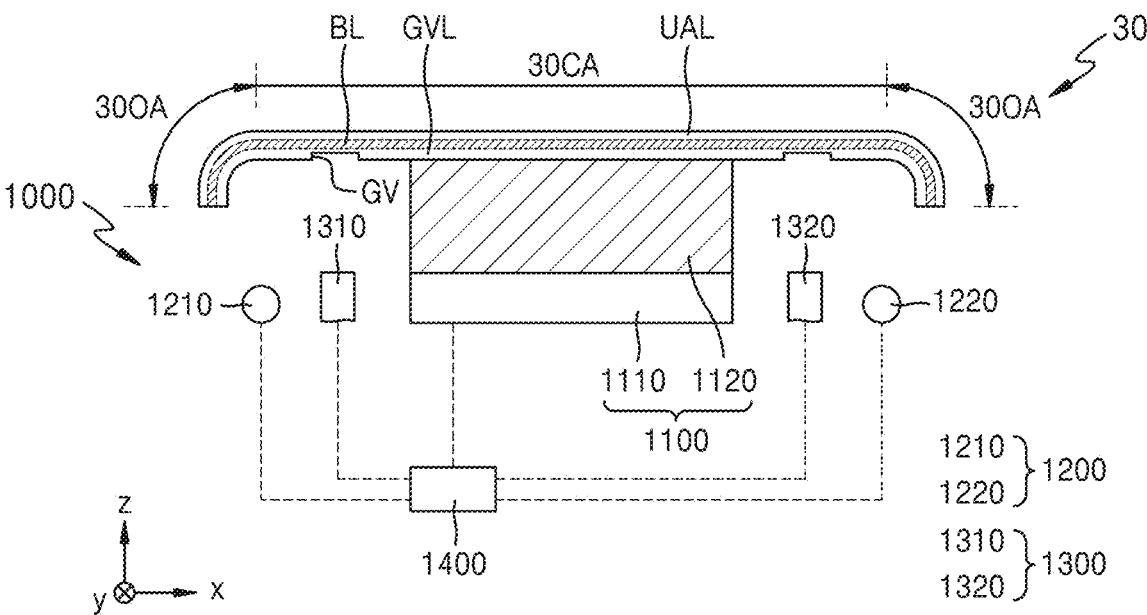
FIG. 12 is a view of an embodiment of an apparatus for attaching a cover panel.

FIG. 12 is a view of an embodiment of an apparatus 1000 for attaching a cover panel.

Referring to FIG. 12, the apparatus 1000 for attaching a cover panel may attach the cover panel 30 to the display panel. The apparatus 1000 for attaching a cover panel may include a pad member 1100, a backlight member 1200, a photographing member 1300, and a control member 1400. The cover panel 30 may be disposed (e.g., seated) on the pad member 1100. The cover panel 30 may be disposed (e.g., seated) such that the groove layer GVL of the cover panel 30 faces the pad member 1100. When the cover panel 30 is disposed (e.g., seated), the light-blocking layer BL may be separated farther from the pad member 1100 than the groove layer GVL. Accordingly, the plurality of grooves GV may face the −z direction of FIG. 12.

The pad member 1100 may include a first member 1110 and a second member 1120. The first member 1110 is movable or rotatable. In an embodiment, the first member 1110 may move in the first direction (e.g., the x direction or the −x direction), the second direction (e.g., the y direction or the −y direction), and/or a third direction (e.g., a z direction or a −z direction). The first member 1110 may rotate around an axis extending in the third direction (e.g., a z direction or a −z direction). The position of the cover panel 30 may be changed according to the movement or rotation of the first member 1110. The first member 1110 may be a movable or rotatable machine apparatus widely known to those of ordinary skill in the art. The second member 1120 may be a pad. The second member 1120 may be disposed on the first member 1110. In an embodiment, the second member 1120 may include silicone, for example.

The pad member 1100 may rise to attach the cover panel 30 to the display panel. In an embodiment, the first member 1110 may move in the third direction (e.g., a z direction or a −z direction), and the cover panel 30 disposed (e.g., seated) on the pad member 1100 may rise.

The backlight member 1200 may irradiate light into the plurality of grooves GV. In an embodiment, the backlight member 1200 may be disposed below the cover panel 30. The backlight member 1200 may be adjacent to the pad member 1100. The backlight member 1200 may be provided in plural. In an embodiment, the backlight member 1200 may include a first backlight member 1210 and a second backlight member 1220. The first backlight member 1210 may irradiate light into one of the plurality of grooves GV, and the second backlight member 1220 may irradiate light into another of the plurality of grooves GV.

The photographing member 1300 may face the groove layer GVL. The photographing member 1300 may photograph the position of the plurality of grooves GV by receiving light reflected by the plurality of grooves GV. The photographing member 1300 may be adjacent to the pad member 1100. In an embodiment, the photographing member 1300 may be a camera.

The photographing member 1300 may be provided in plural. In the case where the plurality of photographing members 1300 is provided, the positions of the plurality of grooves GV may be photographed swiftly. In another embodiment, one photographing member 1300 may be provided. Hereinafter, the case where the plurality of photographing members 1300 is provided is mainly described in detail.

The photographing member 1300 may include a first photographing member 1310 and a second photographing member 1320. The first photographing member 1310 may be spaced apart from the second photographing member 1320. Since each of the plurality of grooves GV is adjacent to the cover outer area 30OA, even though the first photographing member 1310 and the second photographing member 1320 each include a barrel, they may not interfere with each other. The first photographing member 1310 may photograph one of the plurality of grooves GV, and the second photographing member 1320 may photograph another of the plurality of grooves GV. In another embodiment, the photographing member 1300 may include more photographing members including a third photographing member.

The photographing member 1300 may move horizontally. In an embodiment, the photographing member 1300 may move in the first direction (e.g., the x direction or the −x direction) and/or in the second direction (e.g., the y direction or the −y direction). Accordingly, a small number of photographing members 1300 may photograph the plurality of grooves GV.

The backlight member 1200 may be adjacent to the photographing member 1300. In an embodiment, the first backlight member 1210 may be adjacent to the first photographing member 1310. The second backlight member 1220 may be adjacent to the second photographing member 1320. Accordingly, the backlight member 1200 may irradiate light such that the photographing member 1300 photograph the plurality of grooves GV, and the photographing member 1300 may clearly photograph the plurality of grooves GV.

The control member 1400 may control the pad member 1100, the backlight member 1200, and the photographing member 1300. In an embodiment, the control member 1400 may be a computer. The control member 1400 may control the position of the pad member 1100. In an embodiment, the control member 1400 may control the first member 1110 to move or rotate. In an embodiment, the control member 1400 may control the backlight member 1200 to irradiate light. In an embodiment, the control member 1400 may control the photographing member 1300 to move horizontally. The control member 1400 may control the photographing member 1300 to photograph the plurality of grooves GV.

The control member 1400 may align the position of the pad member 1100 based on information for the position of the plurality of grooves GV photographed and information for the position of the plurality of grooves GV set in advance. In an embodiment, in the case where the position of the plurality of grooves GV photographed is different from the position of the plurality of grooves GV set in advance, the control member 1400 may control the first member 1110 to move or rotate. Accordingly, the positions of the plurality of grooves GV may be changed into the positions set in advance, and the apparatus 1000 for attaching a cover panel may accurately attach the cover panel 30 to the display panel.

The control member 1400 may obtain information for the position of one of the plurality of grooves GV, and then, horizontally move the photographing member 1300 to obtain information for the position of another of the plurality of grooves GV. Accordingly, the plurality of grooves GV may be photographed by a small number of photographing members 1300.

Figure 13:
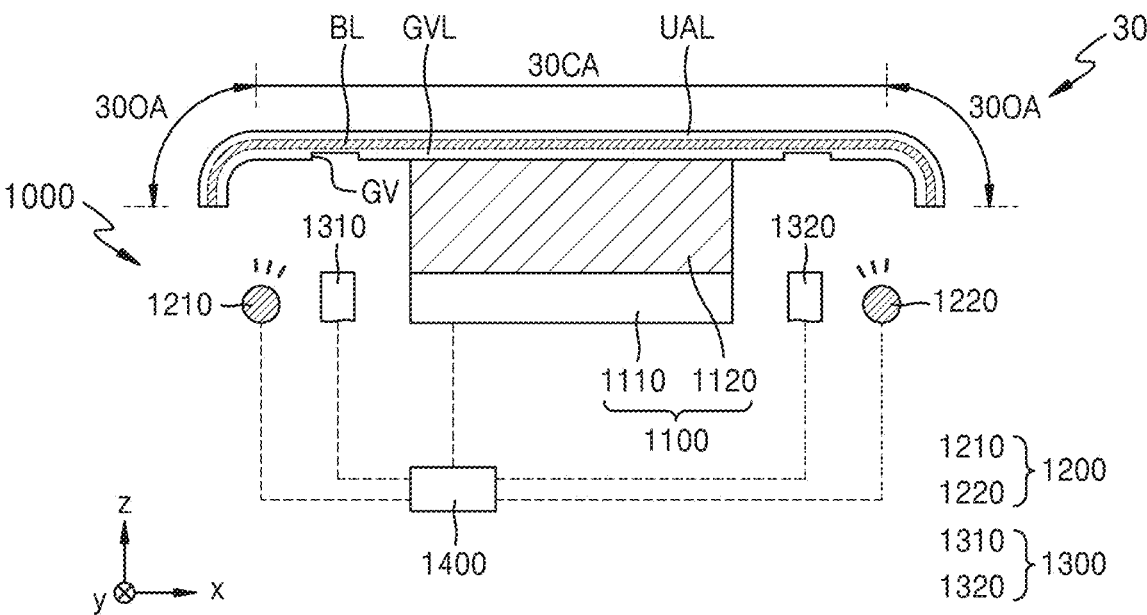
FIG. 13 is a view of an embodiment of a method of attaching a cover panel.
Figure 14A:
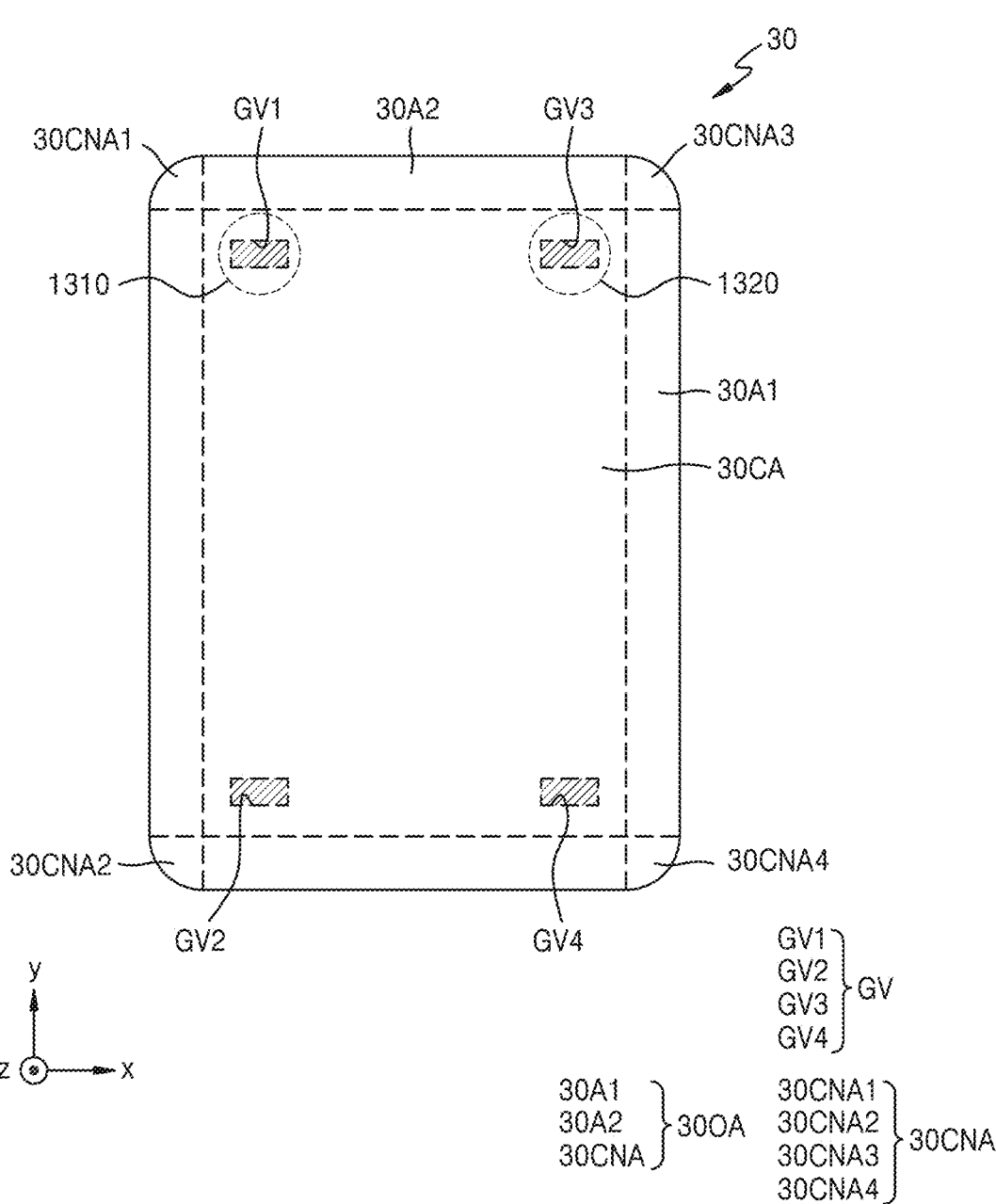
FIGS. 14A and 14B are plan views of an embodiment of a method of attaching a cover panel.
Figure 14B:
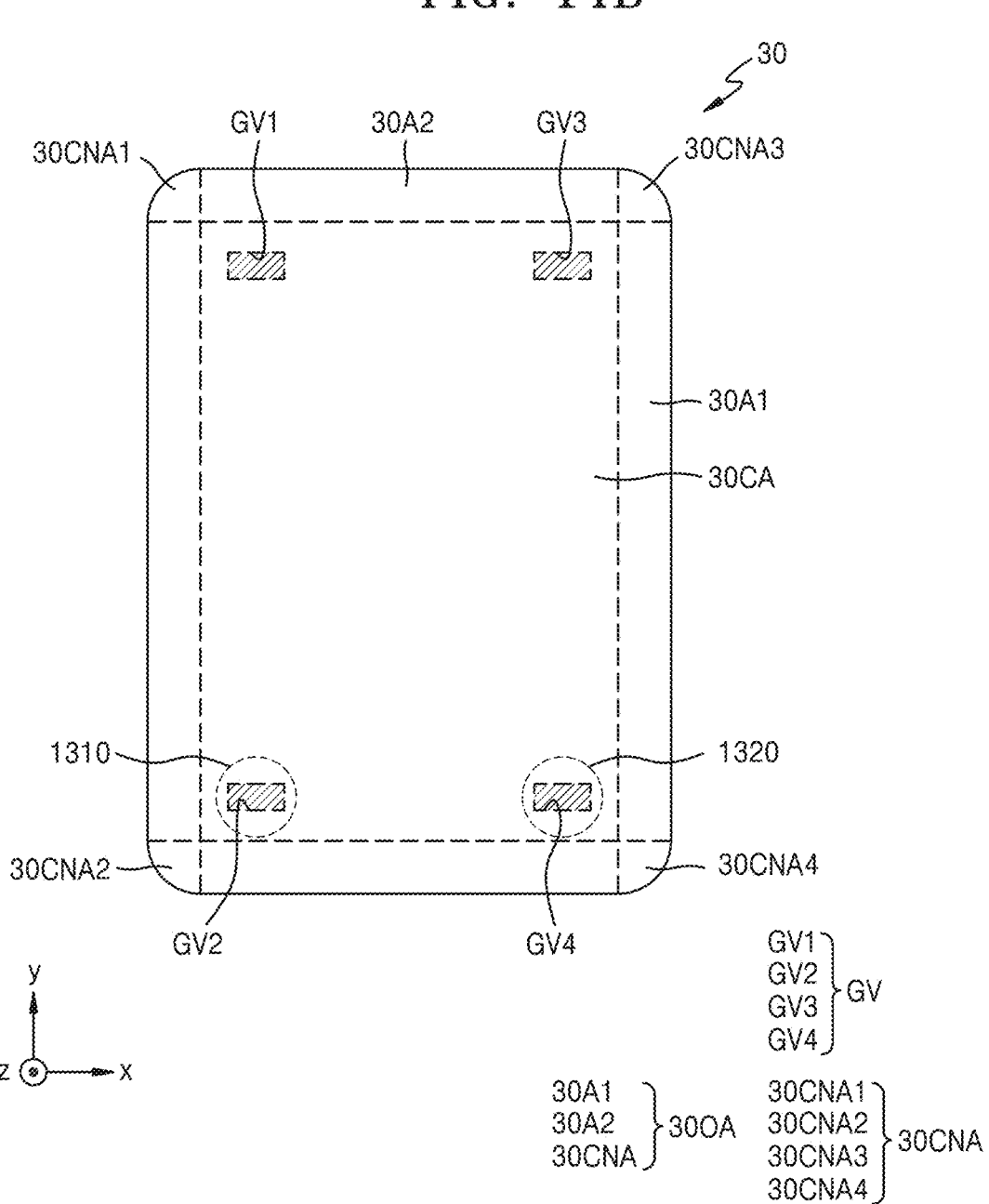
Figure 15:
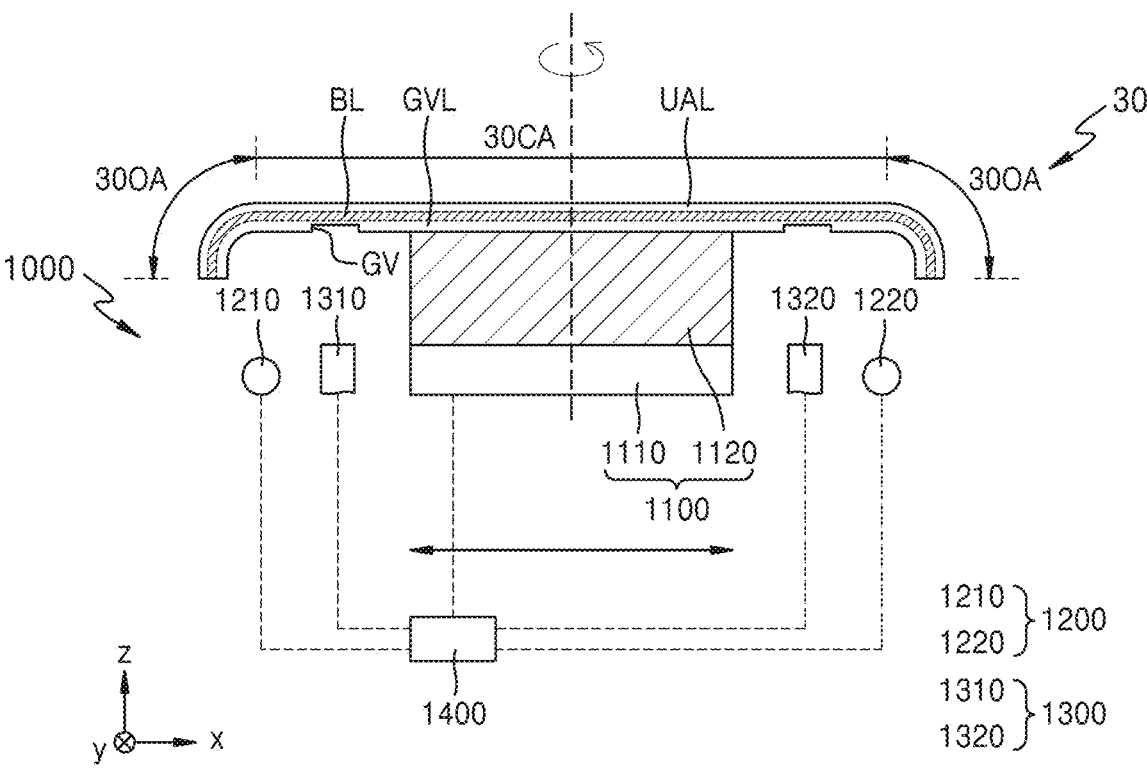
FIGS. 15 to 17 are views showing an embodiment of a method of attaching a cover panel.
Figure 16:
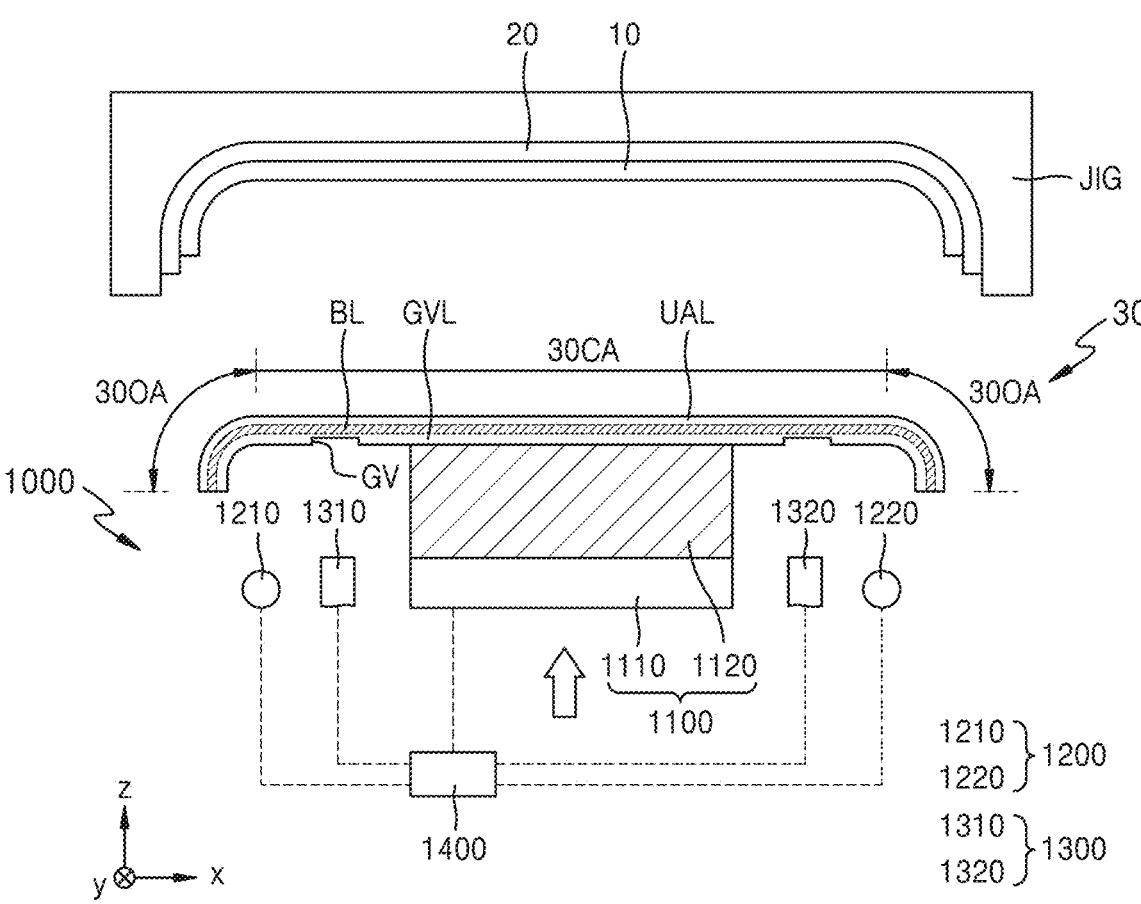
Figure 17:
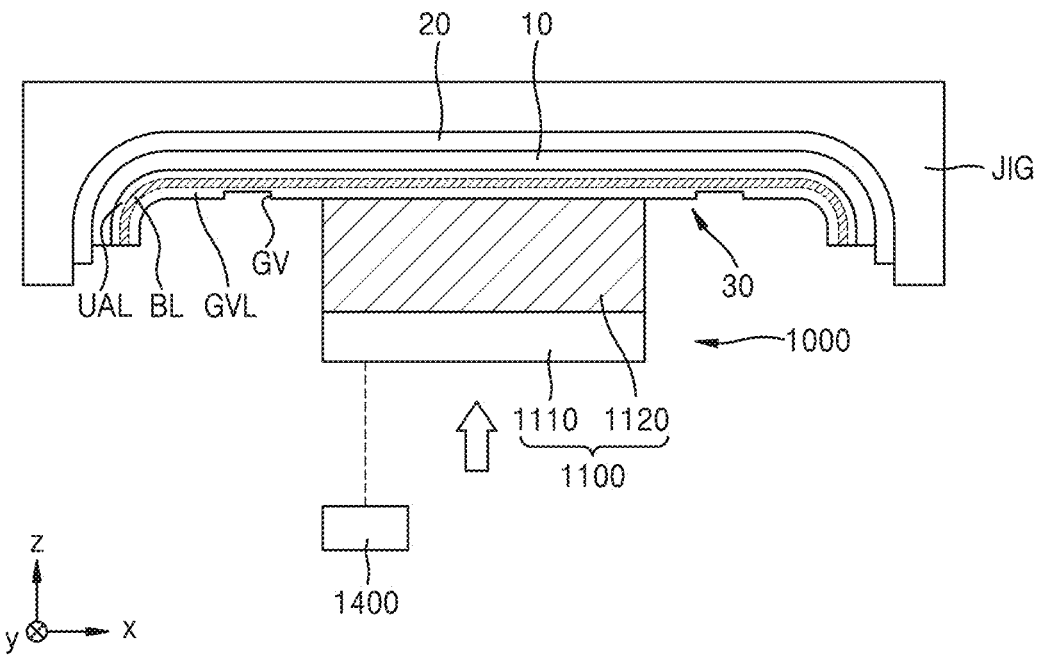

FIG. 13 is a view of an embodiment of a method of attaching the cover panel 30. FIGS. 14A and 14B are plan views of an embodiment of a method of attaching the cover panel 30. FIGS. 15 to 17 are views showing an embodiment of a method of attaching the cover panel 30.

Referring to FIG. 13, the cover panel 30 may be disposed (e.g., seated) on the pad member 1100. The groove layer GVL of the cover panel 30 may face the pad member 1100.

Next, the control member 1400 may obtain information for the positions of the plurality of grooves GV by photographing the plurality of grooves GV. First, the backlight member 1200 may irradiate light into the plurality of grooves GV. In an embodiment, the first backlight member 1210 may irradiate light into one of the plurality of grooves GV, and the second backlight member 1220 may irradiate light into another of the plurality of grooves GV.

Next, the photographing member 1300 may photograph the positions of the plurality of grooves GV by receiving light reflected by the plurality of grooves GV. In an embodiment, because the plurality of grooves GV may each include the metal layer opening, the organic layer opening, and the lower surface of the cushion layer, the control member 1400 may recognize the plurality of grooves GV.

Referring to FIGS. 14A and 14B, the plurality of grooves GV may include the first groove GV1, the second groove GV2, the third groove GV3, and the fourth groove GV4. In an embodiment, the photographing member 1300 may photograph the first groove GV1, and then, photograph the second groove GV2.

In an embodiment, the first photographing member 1310 and the second photographing member 1320 may respectively photograph the first groove GV1 and the third groove GV3. In an embodiment, the second photographing member 1320 may photograph the third groove GV3 while the first photographing member 1310 photographs the first groove GV1.

Next, the first photographing member 1310 and the second photographing member 1320 may move. In an embodiment, the first photographing member 1310 and the second photographing member 1320 may move in the second direction (e.g., the y direction or the −y direction). In this case, the control member 1400 may control the first photographing member 1310 and the second photographing member 1320 to move.

Next, the first photographing member 1310 and the second photographing member 1320 may respectively photograph the second groove GV2 and the fourth groove GV4. In an embodiment, the second photographing member 1320 may photograph the fourth groove GV4 while the first photographing member 1310 photographs the second groove GV2. Accordingly, the plurality of grooves GV may be photographed swiftly by a small number of photographing members 1300.

Referring to FIG. 15, the control member 1400 may adjust the position of the cover panel 30 based on information for the positions of the plurality of grooves GV photographed and information for the positions of the plurality of grooves GV set in advance. In an embodiment, in the case where the position of the plurality of grooves GV photographed is different from the position of the plurality of grooves GV set in advance, the control member 1400 may control the first member 1110 to move or rotate. In an embodiment, the first member 1110 may move in the first direction (e.g., the x direction or the −x direction) and/or in the second direction (e.g., the y direction or the −y direction). In an embodiment, the first member 1110 may rotate around an axis extending in the third direction (e.g., the z direction or the −z direction). Accordingly, the positions of the plurality of grooves GV may be changed to the positions of the plurality of grooves GV.

Referring to FIGS. 16 and 17, the cover panel 30 may be attached to the display panel 10. In an embodiment, the control member 1400 may control the pad member 1100, and the pad member 1100 may rise. Accordingly, the cover panel 30 may be accurately aligned and attached to the display panel 10.

Next, the apparatus 1000 for attaching a cover panel may be removed.

Figure 18:
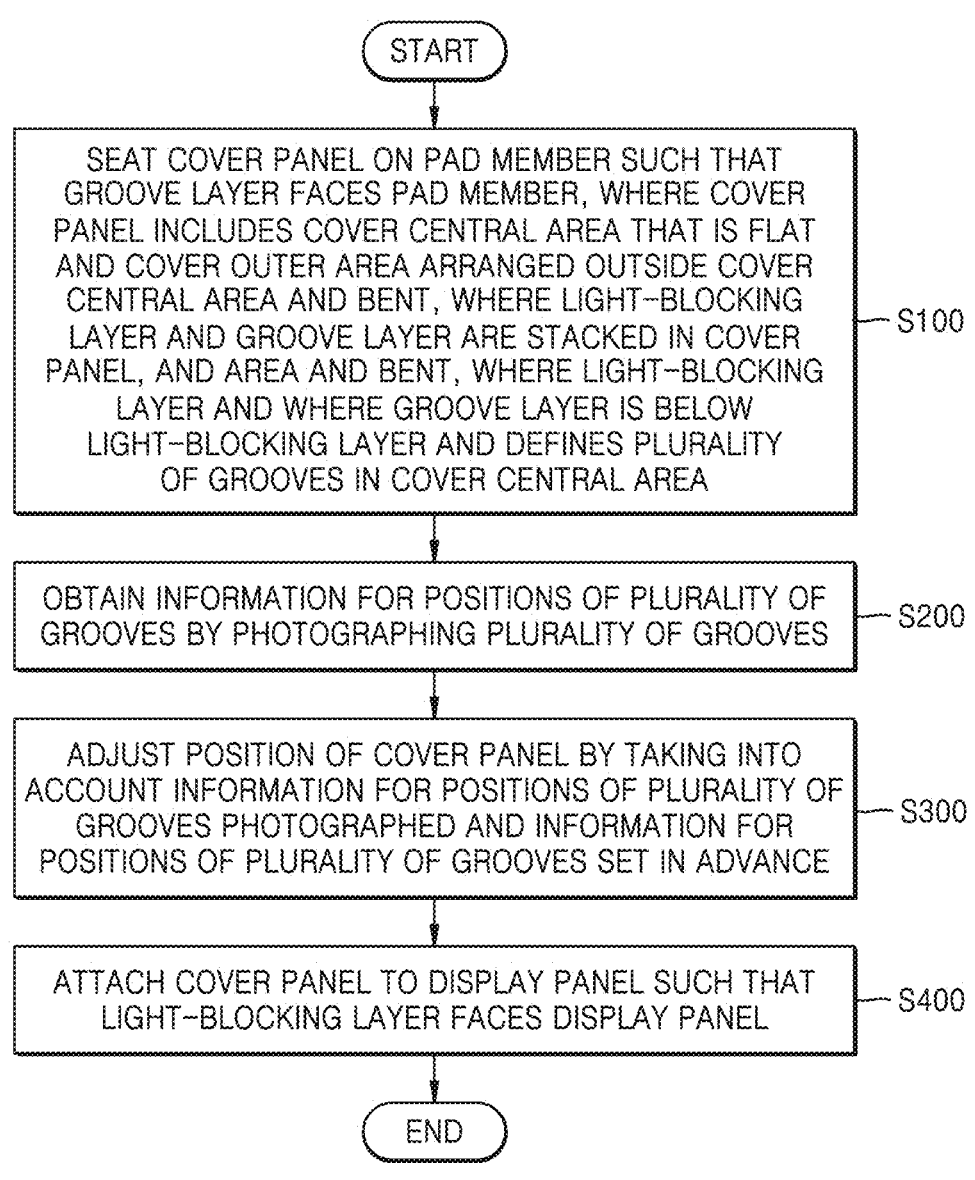
FIG. 18 is a flowchart showing an embodiment of a method of attaching a cover panel.

FIG. 18 is a flowchart showing an embodiment of a method of attaching a cover panel.

Referring to FIG. 18, the method of attaching a cover panel in an embodiment may dispose (e.g., seat) a cover panel on the pad member such that the groove layer faces the pad member. The cover panel includes the cover central area that is flat and the cover outer area disposed outside the cover central area and bent. The light-blocking layer and the groove layer are stacked in the cover panel. The groove layer is disposed below the light-blocking layer and includes the plurality of grooves in the cover central area (S100). Next, the method may obtain information for the positions of the plurality of grooves by photographing the plurality of grooves (S200). Next, the method may adjust the position of the cover panel based on information for the positions of the plurality of grooves photographed and the information for the positions of the plurality of grooves set in advance (S300). Next, the method may attach the cover panel to the display panel such that the light-blocking layer faces the display panel (S400).

The display apparatus in an embodiment may include the cover panel including the light-blocking layer and the groove layer that are stacked, the light-blocking layer may be disposed below the display panel, the groove layer may be disposed below the light-blocking layer and the plurality of grooves may be defined in the groove layer in the cover central area. Accordingly, the cover panel has a light-blocking function of not transmitting external light to the display panel, and simultaneously, the plurality of grooves may be used as alignment marks.

In addition, because the apparatus for attaching a cover panel in an embodiment may include the backlight member which irradiates light into the plurality of grooves of the cover panel, and the photographing member that photographs the positions of the plurality of grooves by receiving light reflected by the plurality of grooves, the cover panel may be accurately aligned.

In addition, the method of attaching a cover panel in an embodiment may adjust the position of the cover panel based on information for the positions of the plurality of grooves photographed and information for the positions of the plurality of grooves set in advance. Accordingly, the cover panel may be accurately aligned and attached to the display panel.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
a display panel including a central area and an outer area outside the central area and which is bent, the display panel including:
a first surface displaying an image;
a second surface opposite to the first surface; and
a substrate including a lower surface defining the second surface; and
a cover panel including:
a cover central area overlapping the central area;
a cover outer area overlapping the outer area;
an adhesive layer directly contacting the second surface of the display panel;
a light-blocking layer disposed below the second surface of the display panel, disposed outside the display panel, closer to the second surface of the display panel than the first surface of the display panel and directly contacting the adhesive layer; and
a groove layer disposed on a first surface of the light-blocking layer opposite to a second surface of the light-blocking layer facing the display panel,
wherein the outer area includes:
a first adjacent area adjacent to the central area in a first direction;
a second adjacent area adjacent to the central area in a second direction crossing the first direction; and
a corner area at least partially surrounding the first adjacent area, the central area, and the second adjacent area,
wherein the first adjacent area, the second adjacent area, and the central area are bent,
wherein the corner area includes a plurality of corner areas,
wherein the cover outer area includes a plurality of cover corner areas respectively overlapping the plurality of corner areas,
wherein a plurality of grooves is defined in the groove layer in the cover central area,
wherein the plurality of grooves is discontinuously arranged and spaced apart from each other in a plan view, and each of the plurality of grooves is adjacent to the plurality of cover corner areas, and wherein the groove layer has a flat surface in an area between the plurality of grooves in the cover central area.

2. The apparatus of claim 1, wherein the cover central area is flat.

3. The apparatus of claim 1, wherein the cover outer area includes a cover corner area overlapping the corner area, and the light-blocking layer is disposed in the cover central area and the cover corner area.

4. The apparatus of claim 1, wherein the corner area includes a plurality of extension areas extending in a direction away from the central area, and wherein a separation area is defined between adjacent extension areas of the plurality of extension areas.

5. The apparatus of claim 1, wherein the groove layer includes:

a cushion layer disposed on the first surface of the light-blocking layer;

an organic layer which is disposed on a first surface of the cushion layer opposite to a second surface of the cushion layer facing the light-blocking layer and in which an organic layer opening which exposes the first surface of the cushion layer is defined; and a metal layer which is disposed on a first surface of the organic layer opposite to a second surface of the organic layer facing the cushion layer and in which a metal layer opening which overlaps the organic layer opening is defined, wherein the plurality of grooves each includes the first surface of the cushion layer, the organic layer opening, and the metal layer opening.

6. An electronic apparatus comprising:

a display apparatus comprising:

a display panel including a central area and an outer area outside the central area and which is bent, the display panel including:

a first surface displaying an image;

a second surface opposite to the first surface; and a substrate including a lower surface defining the second surface; and a cover panel including:

a cover central area overlapping the central area;

a cover outer area overlapping the outer area;

an adhesive layer directly contacting the second surface of the display panel;

a light-blocking layer disposed below the second surface of the display panel, disposed outside the display panel, closer to the second surface of the display panel than the first surface of the display panel and directly contacting the adhesive layer; and a groove layer disposed on a first surface of the light-blocking layer opposite to a second surface of the light-blocking layer facing the display panel, wherein the outer area includes:

a first adjacent area adjacent to the central area in a first direction;

a second adjacent area adjacent to the central area in a second direction crossing the first direction; and a corner area at least partially surrounding the first adjacent area, the central area, and the second adjacent area, wherein the first adjacent area, the second adjacent area, and the central area are bent, wherein the corner area includes a plurality of corner areas, wherein the cover outer area includes a plurality of cover corner areas respectively overlapping the plurality of corner areas, wherein a plurality of grooves is defined in the groove layer in the cover central area, wherein the plurality of grooves is discontinuously arranged and spaced apart from each other in a plan view, and each of the plurality of grooves is adjacent to the plurality of cover corner areas, and wherein the groove layer has a flat surface in an area between the plurality of grooves in the cover central area.

7. The electronic apparatus of claim 6, wherein the cover central area is flat.

8. The electronic apparatus of claim 6, wherein the cover outer area includes a cover corner area overlapping the corner area, and the light-blocking layer is disposed in the cover central area and the cover corner area.

9. The electronic apparatus of claim 6, wherein the corner area includes a plurality of extension areas extending in a direction away from the central area, and wherein a separation area is defined between adjacent extension areas of the plurality of extension areas.

\* \* \* \* \*